(12) United States Patent
Ardalan et al.

(10) Patent No.: US 11,163,120 B2
(45) Date of Patent: Nov. 2, 2021

(54) FIBER ATTACH ENABLED WAFER LEVEL FANOUT

(71) Applicant: Ayar Labs, Inc., Emeryville, CA (US)

(72) Inventors: Shahab Ardalan, Emeryville, CA (US); Michael Davenport, Emeryville, CA (US); Roy Edward Meade, Lafayette, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 16/685,838

(22) Filed: Nov. 15, 2019

(65) Prior Publication Data

US 2020/0158959 A1 May 21, 2020

Related U.S. Application Data

(60) Provisional application No. 62/768,456, filed on Nov. 16, 2018.

(51) Int. Cl.
| | |
|---|---|
| *G02B 6/30* | (2006.01) |
| *G02B 6/122* | (2006.01) |
| *H01L 21/56* | (2006.01) |
| *G02B 6/42* | (2006.01) |

(52) U.S. Cl.
CPC ............... *G02B 6/30* (2013.01); *G02B 6/122* (2013.01); *H01L 21/565* (2013.01); *G02B 6/428* (2013.01)

(58) Field of Classification Search
CPC .......... G02B 6/30; G02B 6/122; H01L 21/565
USPC .......................................................... 385/14
See application file for complete search history.

(56) References Cited

U.S. PATENT DOCUMENTS

| | | | | |
|---|---|---|---|---|
| 9,632,261 | B1* | 4/2017 | Zortman | G02B 6/4204 |
| 2009/0080486 | A1* | 3/2009 | Ju | H01S 3/063 |
| | | | | 372/50.11 |
| 2010/0111473 | A1* | 5/2010 | Pinguet | G02B 6/4208 |
| | | | | 385/37 |
| 2011/0075970 | A1* | 3/2011 | Schrauwen | G02B 6/34 |
| | | | | 385/37 |

(Continued)

OTHER PUBLICATIONS

Barwicz, Tymon and Yoichi Taira, "Low-Cost Interfacing of Fibers to Nanophotonic Waveguides: Design for Fabrication and Assembly Tolerances," IEEE Photonics Journal, vol. 6, No. 4, Aug. 2014.

(Continued)

*Primary Examiner* — Kaveh C Kianni
(74) *Attorney, Agent, or Firm* — Penilla IP, APC

(57) ABSTRACT

A package assembly includes a silicon photonics chip having an optical waveguide exposed at a first side of the chip and an optical fiber coupling region formed along the first side of the chip. The package assembly includes a mold compound structure formed to extend around second, third, and fourth sides of the chip. The mold compound structure has a vertical thickness substantially equal to a vertical thickness of the chip. The package assembly includes a redistribution layer formed over the chip and over a portion of the mold compound structure. The redistribution layer includes electrically conductive interconnect structures to provide fanout of electrical contacts on the chip to corresponding electrical contacts on the redistribution layer. The redistribution layer is formed to leave the optical fiber coupling region exposed. An optical fiber is connected to the optical fiber coupling region in optical alignment with the optical waveguide within the chip.

18 Claims, 18 Drawing Sheets

(56) References Cited

U.S. PATENT DOCUMENTS

| | | | | |
|---|---|---|---|---|
| 2013/0005606 A1* | 1/2013 | Chakravarty | ........ | G01N 21/255 506/9 |
| 2013/0209112 A1* | 8/2013 | Witzens | .................... | G02B 6/13 398/214 |
| 2013/0279844 A1* | 10/2013 | Na | ........................ | G02B 6/1228 385/14 |
| 2014/0140655 A1* | 5/2014 | Chakravarty | .......... | B82Y 20/00 385/12 |
| 2014/0205234 A1* | 7/2014 | Rong | .................... | G02B 6/1223 385/28 |
| 2014/0294342 A1* | 10/2014 | Offrein | .................... | G02B 6/43 385/14 |
| 2014/0346532 A1* | 11/2014 | Kim | ........................ | H01L 27/15 257/84 |
| 2015/0153524 A1* | 6/2015 | Chen | .................... | G02B 6/4228 385/14 |
| 2015/0212266 A1* | 7/2015 | Czornomaz | ........ | G02B 6/12004 385/14 |
| 2017/0082799 A1* | 3/2017 | Novack | ................. | G01R 31/308 |
| 2018/0019139 A1* | 1/2018 | Sun | ......................... | B05D 1/005 |
| 2018/0210009 A1* | 7/2018 | Aksyuk | .................. | G01Q 70/10 |
| 2018/0313718 A1* | 11/2018 | Traverso | ................. | G02B 6/305 |
| 2020/0127438 A1* | 4/2020 | Bovington | .............. | H01S 5/026 |

OTHER PUBLICATIONS

Barwicz, Tymon et al., "An O-band Metamaterial Converter Interfacing Standard Optical Fibers to Silicon Nanophotonic Waveguides," Optical Society of America, 2015 Optical Fiber Communications Conference and Exhibition (OFC), Mar. 22, 2015.

Polster, Robert, et al., "Wafer-Scale High-Density Edge Coupling for High Throughput Testing of Silicon Photonics," Optical Society of America, 2018 Optical Fiber Communications Conference and Exposition (OFC), Mar. 11, 2018.

* cited by examiner (View B-B)

(View C-C)

(View C-C)

(View C-C)

(View C-C)

(View D-D)

(View D-D)

(View D-D)

(View D-D)

(View D-D)

(View E-E)

1601 — Having a wafer including a plurality of silicon photonics chips formed within the wafer, each silicon photonics chip including a frame region, the frame region including a number of photonics devices and a number of optical waveguides, each silicon photonics chip including an exterframe region, the exterframe region including a number of optical grating couplers optically connected to some of the number of optical waveguides within the frame region to enable testing of the number of photonics devices within the frame region.

1603 — Optically testing the number of photonics devices within the frame region of each of the plurality of silicon photonics chips within the wafer intact.

1605 — After completion of optically testing the number of photonics devices, forming an optical fiber coupling region within each of the plurality of silicon photonics chips within the wafer intact, the optical fiber coupling region of a given silicon photonics chip including a cavity formed along a side of the frame region of the given silicon photonics chip, the optical fiber coupling region of the given silicon photonics chip including a number of optical fiber alignment features.

1607 — Disposing a filler material within the cavity of the optical fiber coupling region of each silicon photonics chip on the wafer, such that an exposed surface of the filler material is substantially planar with a surface of the silicon photonics chip adjacent to the optical fiber coupling region.

Fig. 16

1701 — Having a plurality of silicon photonics chips, each of the plurality of silicon photonics chips including a frame region that includes a number of photonics devices and a number of optical waveguides, each of the plurality of silicon photonics chips including an optical fiber coupling region that includes a cavity formed along a side of the frame region, the optical fiber coupling region including a number of optical fiber alignment features, the cavity of the optical fiber coupling region filled with a filler material, each of the plurality of silicon photonics chips including an exterframe region that includes a number of optical grating couplers and corresponding optical waveguides, the optical fiber coupling region formed between the frame region and the exterframe region in each of the plurality of silicon photonics chips.

1703 — Temporarily securing the plurality of silicon photonics chips to a first support wafer with the filler material facing toward the first support wafer.

1705 — Disposing a mold compound material over the support wafer and around each of the plurality of silicon photonics chips, such that an upper surface of the mold compound material is substantially planar with exposed surfaces of the plurality of silicon photonics chip, the mold compound and the plurality of silicon photonics chips collectively forming an integral structure.

1707 — Removing the first support wafer from the integral structure of the mold compound and the plurality of silicon photonics chips.

1709 — Securing the integral structure of the mold compound and the plurality of silicon photonics chips to a second support wafer with the filler material facing away from the second support wafer.

1711 — Forming a redistribution layer over the integral structure of the mold compound and the plurality of silicon photonics chips, the redistribution layer including electrically conductive interconnect structures to provide fanout of electrical contacts on each of the plurality of silicon photonics chips to corresponding electrical contacts on an exposed surface of the redistribution layer, where the redistribution layer is formed to leave the optical fiber coupling region of each of the plurality of silicon photonics chips exposed.

1713 — Trimming each of the plurality of silicon photonics chips to remove both the corresponding exterframe region and a portion of the redistribution layer overlying the corresponding exterframe region, where the trimming exposes a side of the optical fiber coupling region of each of the plurality of silicon photonics chips.

1715 — Segmenting the second support wafer to obtain each of the plurality of silicon photonics chips in a separately packaged form.

Fig. 17

FIBER ATTACH ENABLED WAFER LEVEL FANOUT

CLAIM OF PRIORITY

This application claims priority under 35 U.S.C. 119(e) to U.S. Provisional Patent Application No. 62/768,456, filed Nov. 16, 2018, the disclosure of which is incorporated herein by reference in its entirety for all purposes.

GOVERNMENT LICENSE RIGHTS

This invention was made with government support under contract number DE-AR0000850 awarded by the U.S. Department of Energy (DOE), Office of ARPA-E. The government has certain rights in this invention.

BACKGROUND

In semiconductor device fabrication, integrated circuit packaging is a later stage of fabrication in which an integrated circuit chip is encapsulated in a supporting package that supports electrical contacts to enable connection of the integrated circuit chip to one or more external devices. The electronics industry has developed a multitude of package styles, including wire bonding, flip-chip onto both organic and ceramic substrates, flip-chip onto silicon and glass interposers, package-on-package, and wafer/panel-level fan-out and fan-in, among others. Diversity in package styles in the electronics industry is intended to support different cost and performance requirements. For example, lower power applications (e.g., mobile device applications) often use wafer-level fan-out technology. And, 2.5D silicon interposers are used for High Performance Computing (HPC) applications. The term "2.5D" refers to a packaging methodology in which multiple chips are included inside the same package.

It is expected that packaging in the silicon photonics industry that provides for fiber-to-chip coupling will develop along similar lines as packaging in the electronics industry. For example, in the silicon photonics industry, different package approaches can be based on the number of optical fibers that are to be connected to the packaged chip(s), the total power dissipated by the packaged chip(s), and/or other considerations. Also, there are a number of approaches for attaching optical fibers to chips, such as described in "An O-band Metamaterial Converter Interfacing Standard Optical Fibers to Silicon Nanophotonic Waveguides," by Tymon Barwicz et al., Optical Fiber Communications Conference and Exhibition (OFC), 2015, IEEE, 2015, and as described in "Low-Cost Interfacing of Fibers to Nanophotonic Waveguides: Design for Fabrication and Assembly Tolerances," by Tymon Barwicz and Yoichi Taira, IEEE Photonics Journal 6.4, 2014, 1-18. Additionally, concepts exist for enabling vertical coupling of optical fibers to chips and test integration, such as described in U.S. Pat. No. 10,359,567. Also, the photonics industry has investigated methods to enable wafer-level testing of edge-coupled silicon photonics, such as described in "Wafer-Scale High-Density Edge Coupling for High Throughput Testing of Silicon Photonics," by Robert Polster et al., 2018 Optical Fiber Communications Conference and Exposition (OFC), IEEE, 2018. It is within this context that the present invention arises.

SUMMARY

In an example embodiment, a silicon photonics chip package assembly is disclosed. The package assembly includes a silicon photonics chip that includes at least one optical waveguide exposed at a first side of the silicon photonics chip. The silicon photonics chip also includes an optical fiber coupling region formed along a portion of the first side of the silicon photonics chip. The package assembly also includes a mold compound structure formed to extend around a second side, a third side, and a fourth side of the silicon photonics chip. The mold compound structure has a vertical thickness substantially equal to a vertical thickness of the silicon photonics chip. The package assembly also includes a redistribution layer formed over the silicon photonics chip and over a portion of the mold compound structure. The redistribution layer includes electrically conductive interconnect structures to provide fanout of electrical contacts on the silicon photonics chip to corresponding electrical contacts on an exposed surface of the redistribution layer. The redistribution layer is formed to leave the optical fiber coupling region exposed. The package assembly also includes at least one optical fiber connected to the optical fiber coupling region in optical alignment with the at least one optical waveguide within the silicon photonics chip.

In an example embodiment, a silicon photonics chip is disclosed. The chip includes a frame region that includes a number of photonics devices and a number of optical waveguides. The chip also includes an exterframe region formed outside of the frame region. The exterframe region includes a number of optical grating couplers and corresponding optical waveguides. The optical grating couplers are optically connected to some of the number of optical waveguides within the frame region to enable testing of the number of photonics devices within the frame region.

In an example embodiment, a silicon photonics chip is disclosed. The chip includes a frame region that includes a number of photonics devices and a number of optical waveguides. The chip also includes an optical fiber coupling region that includes a cavity formed along a side of the frame region. The optical fiber coupling region includes a number of optical fiber alignment features. The optical fiber coupling region is formed between the frame region and an exterframe region. The exterframe region includes a number of optical grating couplers and corresponding optical waveguides usable for testing of the number of photonics devices within the frame region before formation of the optical fiber coupling region. The chip also includes a filler material disposed within the cavity of the optical fiber coupling region, such that an exposed surface of the filler material is substantially planar with a surface of the silicon photonics chip adjacent to the optical fiber coupling region.

In an example embodiment, a method is disclosed for wafer-level processing of silicon photonics chips. The method includes an operation for having a wafer including a plurality of silicon photonics chips formed within the wafer. Each silicon photonics chip including a frame region. The frame region includes a number of photonics devices and a number of optical waveguides. Each silicon photonics chip includes an exterframe region. The exterframe region includes a number of optical grating couplers optically connected to some of the number of optical waveguides within the frame region to enable testing of the number of photonics devices within the frame region. The method also includes an operation for optically testing the number of photonics devices within the frame region of each of the plurality of silicon photonics chips with the wafer intact. The method also includes an operation for forming an optical fiber coupling region within each of the plurality of silicon photonics chips, with the wafer intact, after completion of optical testing of the number of photonics devices. The optical fiber coupling region of a given silicon photonics chip includes a cavity formed along a side of the frame region of the given silicon photonics chip. The optical fiber coupling region of the given silicon photonics chip includes a number of optical fiber alignment features. The method also includes an operation for disposing a filler material within the cavity of the optical fiber coupling region of each silicon photonics chip on the wafer, such that an exposed surface of the filler material is substantially planar with a surface of the silicon photonics chip adjacent to the optical fiber coupling region.

In an example embodiment, a method is disclosed for packaging a silicon photonics chip. The method includes an operation for having a plurality of silicon photonics chips. Each of the plurality of silicon photonics chips includes a frame region that includes a number of photonics devices and a number of optical waveguides. Each of the plurality of silicon photonics chips includes an optical fiber coupling region that includes a cavity formed along a side of the frame region. The optical fiber coupling region includes a number of optical fiber alignment features. The cavity of the optical fiber coupling region is filled with a filler material. Each of the plurality of silicon photonics chips includes an exterframe region that includes a number of optical grating couplers and corresponding optical waveguides. The optical fiber coupling region is formed between the frame region and the exterframe region in each of the plurality of silicon photonics chips. The method also includes an operation for temporarily securing the plurality of silicon photonics chips to a first support wafer, with the filler material facing toward the first support wafer. The method also includes an operation for disposing a mold compound material over the support wafer and around each of the plurality of silicon photonics chips, such that an upper surface of the mold compound material is substantially planar with exposed surfaces of the plurality of silicon photonics chips. The mold compound and the plurality of silicon photonics chips collectively form a unitary structure. The method also includes an operation for removing the first support wafer from the unitary structure of the mold compound and the plurality of silicon photonics chips. The method also includes an operation for securing the unitary structure of the mold compound and the plurality of silicon photonics chips to a second support wafer, with the filler material facing away from the second support wafer. The method also includes an operation for forming a redistribution layer over the unitary structure of the mold compound and the plurality of silicon photonics chips. The redistribution layer includes electrically conductive interconnect structures to provide fanout of electrical contacts on each of the plurality of silicon photonics chips to corresponding electrical contacts on an exposed surface of the redistribution layer. The redistribution layer is formed to leave the optical fiber coupling region of each of the plurality of silicon photonics chips exposed. The method also includes an operation for trimming each of the plurality of silicon photonics chips to remove both the corresponding exterframe region and a portion of the redistribution layer overlying the corresponding exterframe region. The trimming exposes a side of the optical fiber coupling region of each of the plurality of silicon photonics chips. The method also includes an operation for singulating the second support wafer to obtain each of the plurality of silicon photonics chips in a separately packaged form.

BRIEF DESCRIPTION OF THE DRAWINGS

FIG. 16 shows a flowchart of a method for wafer-level processing of silicon photonics chips, in accordance with some embodiments.

FIG. 17 shows a flowchart of a method for packaging a silicon photonics chip, in accordance with some embodiments.

DETAILED DESCRIPTION

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

Various embodiments are disclosed herein to alleviate the concern for wafer-level testing of edge-coupled silicon photonics. The silicon photonics industry requires coupling of optical fibers to chips so that light can be transmitted from the optical fibers into the chips and vice-versa. For ease of description, the term "chip" as used herein can refer to a semiconductor chip/die and/or an integrated circuit chip/die, and/or essentially any other electronic chip/die, and/or a photonic chip/die and/or an electro-optical chip/die, and/or any other photonic-equipped chip/die that is formed in a wafer and to which one or more optical fibers connect to provide for transmission of light from the optical fiber(s) to the chip and vice-versa. The coupling of optical fibers to a chip is referred to as fiber-to-chip coupling. Also, for ease of description, the term "wafer" as used herein refers to a substrate within which silicon photonic devices are fabricated. In various embodiments, the wafer can have different sizes and shapes. In some embodiments, the wafer has a circular horizontal cross-section shape. In some embodiments, the wafer has a rectangular horizontal cross-section shape.

Figure 1:
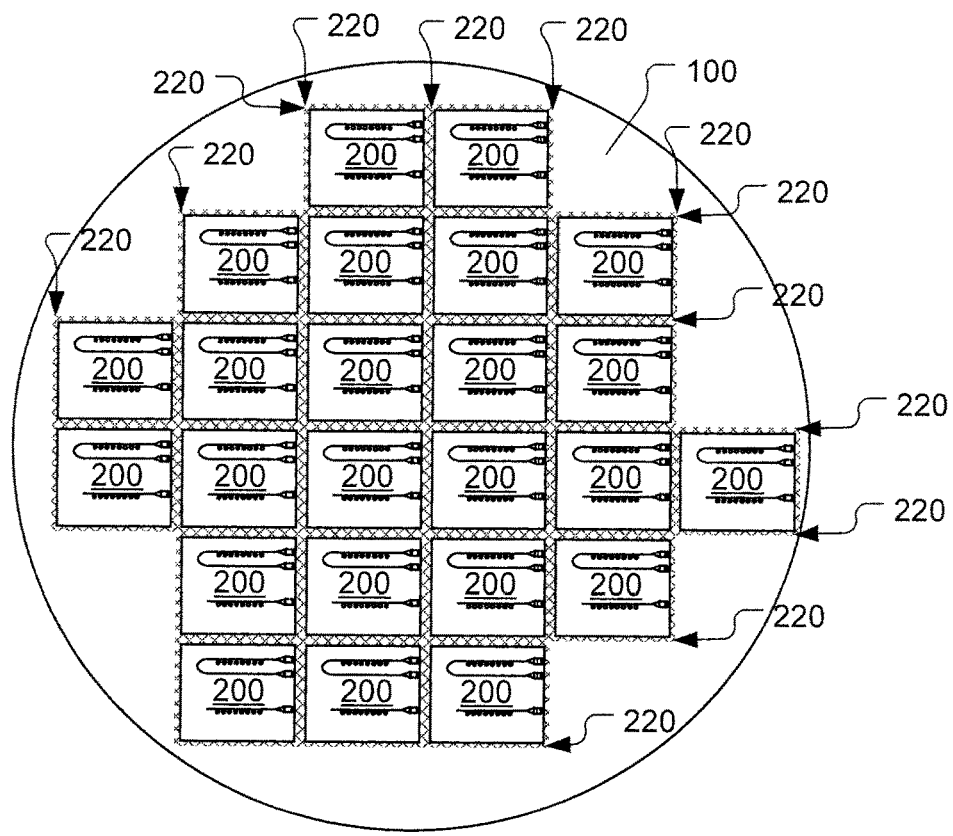
FIG. 1 shows a top view of a wafer that includes multiple silicon photonics chips, in accordance with some embodiments.

FIG. 1 shows a top view of a wafer 100 that includes multiple silicon photonics chips 200, in accordance with some embodiments. Each of the silicon photonics chips 200 is surrounded by scribe line regions 220. It should be understood that the scribe line regions 220 extend both horizontally and vertically between adjacent chips 200 on the wafer 100 and around each of the chips 200 on the wafer 100. After fabrication of the chips 200 on the wafer 100 is completed, the wafer 100 is cut along the scribe line regions 220 to singulate the chips 200 from the wafer 100. It should be understood that the configuration of the wafer 100 (e.g., shape and size of the wafer), and the number and positioning of the silicon photonics chips 200 on the wafer 100, is provided by way of example. In various embodiments, the wafer 100 can include either more or less silicon photonics chips 200 than what is depicted in FIG. 1, and/or the silicon photonics chips 200 can be arranged on the wafer 100 in a different manner than what is shown in FIG. 1. Also, it should be understood that while the example wafer 100 includes multiple instances of the same chip 200, in other embodiments, the wafer 100 can include one or more instances of each of multiple different chips.

Figure 2:
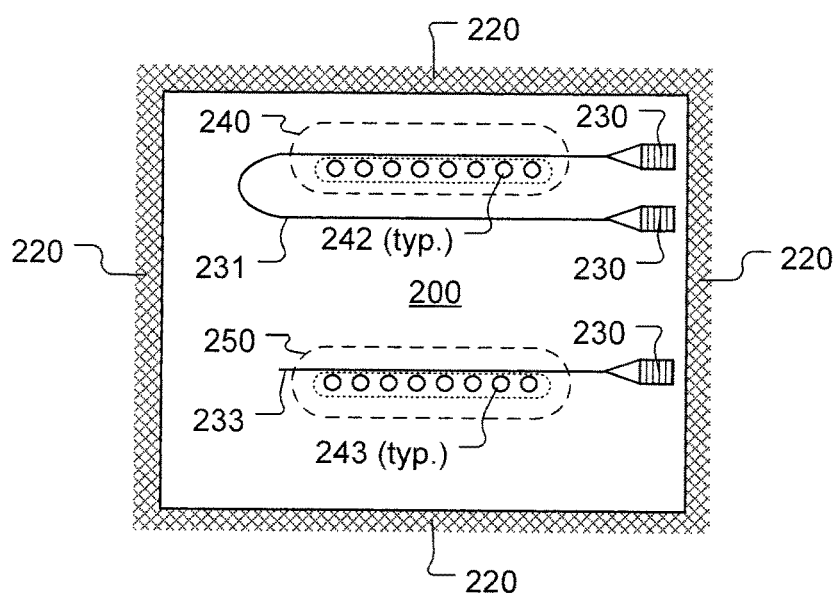
FIG. 2 shows a top view of one of the example silicon photonics chips, in accordance with some embodiments.

FIG. 2 shows a top view of one of the example silicon photonics chips 200, in accordance with some embodiments. The silicon photonics chip 200 is surrounded by scribe line regions 220. More specifically, the scribe line regions 220 are defined outside the perimeter of the silicon photonics chip 200. The scribe line regions 220 demark paths along which the wafer 100 is to be singulated/diced/cut to release each of the silicon photonics chips 200 as a separate physical entity. In some embodiments, the scribe line regions 220 are configured to facilitate the singulation/dicing/cutting of the wafer 100 to release each of the silicon photonics chips 200.

The silicon photonics chip 200 can include various combinations of integrated circuitry (e.g., logic devices, analog devices, memory circuits, etc.) and photonics devices (e.g., optical couplers, optical waveguides, optical resonance rings, etc.). The example silicon photonics chip 200 of FIG. 2 includes vertical optical grating couplers 230, an optical data transmit circuit 240 (e.g., optical modulator devices, etc.), and an optical data receive circuit 250 (e.g., photodetectors, etc.). The optical data transmit circuit 240 includes an optical waveguide 231 that is optically connected between two of the vertical optical grating couplers 230 and that is configured to extend past a number of optical ring modulators 242 which operate to modulate light that travels along the optical waveguide 231 to encode digital data. The optical data receive circuit 250 includes an optical waveguide 233 that is optically connected to one of the vertical optical grating couplers 230 and that is configured to extend past a number of optical ring photodetectors 243 which operate to detect light of one or more particular frequencies that travel along the optical waveguide 233 and decode the detected light into corresponding electrical signals. It should be understood that the optical data transmit circuit 240 and the optical data receive circuit 250 are shown by way of example. In various embodiments, the chip 200 can include one or more photonics circuits of essentially any design and functionality, where some of the one or more photonics circuits includes one or more optical waveguides that are optically connected to one or more optical grating couplers 230.

Figure 3:
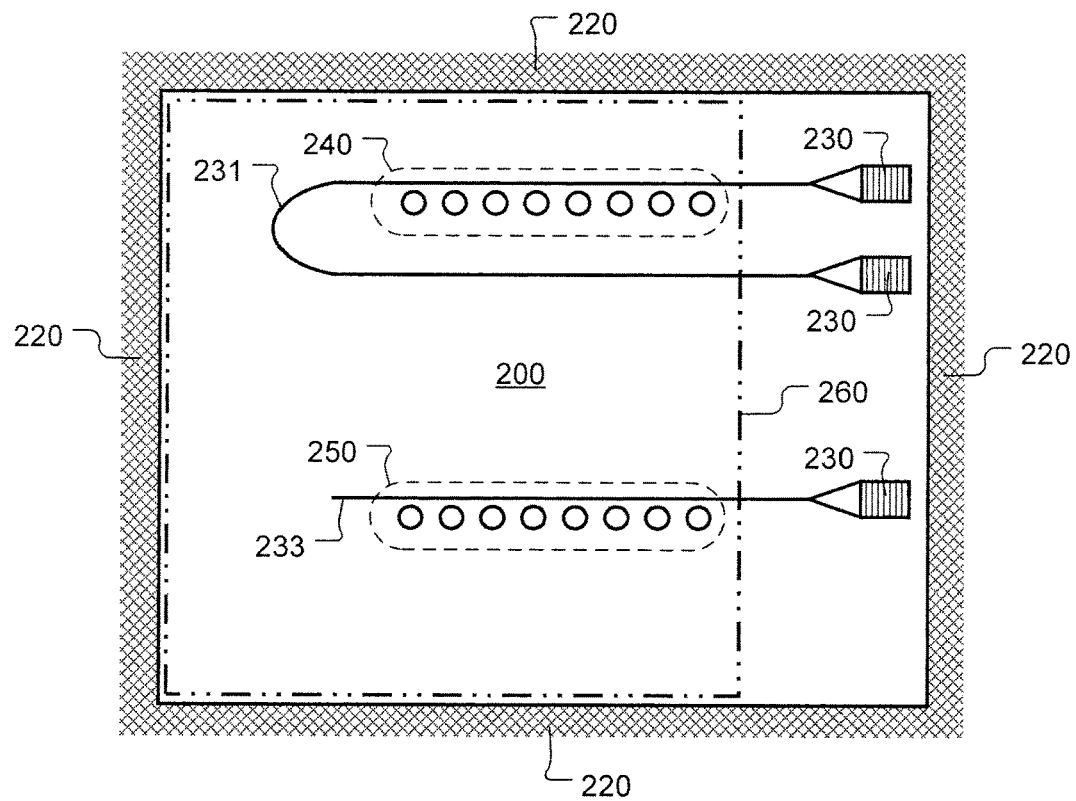
FIG. 3 shows the example silicon photonics chip of FIG. 2, with inclusion of a chip frame, in accordance with some embodiments.

Many semiconductor chips have features designed into the chip that are intended to prevent crack propagation, prevent film delamination, and maintain hermeticity. For example, some chips can include a chip "frame" defined as a periphery where a "crack stop" feature exists. For example, some chip frames can be formed as a combination of metal structures intended to retard the propagation of cracks created during the dicing operation to singulate the chips 200 from the wafer 100. Additionally, the periphery defined by the chip frame can include structures for managing film stress and allowing for silicon nitride passivation to encapsulate the Inter-Level Dielectric (ILD) stack. FIG. 3 shows the example silicon photonics chip 200 of FIG. 2, with inclusion of a chip frame 260, in accordance with some embodiments. FIG. 3 shows that portions of the chip frame 260 are located adjacent to the edges of the silicon photonics chip 200. It should be understood that in various embodiments, the chip frame 260 or portion(s) thereof can be located within the chip 200 at locations away from the edges of the chip 200, such as shown by the right side of the chip frame 260 in FIG. 3.

Figure 4A:
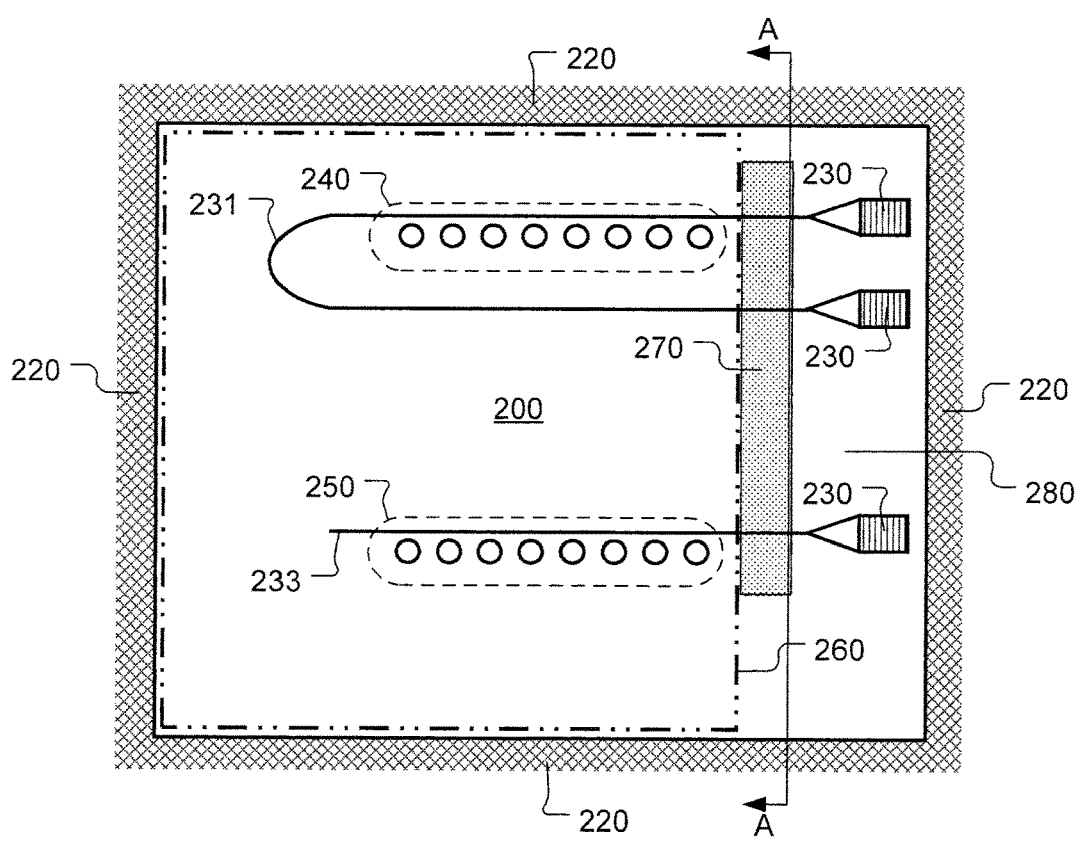
FIG. 4A shows the example silicon photonics chip of FIG. 3, with an exterframe region located outside of the chip frame, in accordance with some embodiments.

FIG. 4A shows the example silicon photonics chip 200 of FIG. 3, with an exterframe region 280 located outside of the chip frame 260, in accordance with some embodiments. In the example of FIG. 4A, the exterframe region 280 is located to the right of the chip frame 260. The exterframe region 280 is not enclosed by the chip frame 260. In some embodiments, the exterframe region 280 can include active electronic and photonic devices, such as optical switches, optical filters, optical modulators, optical detectors, and control circuitry, among essentially any type of photonic and/or electronic component and/or circuitry. In some embodiments, the active electronic and photonic devices within the exterframe region 280 can be used to facilitate photonic testing of the photonic circuits on the chip 200. In the example of FIG. 4A, a fiber coupling region 270 is shown within the exterframe region 280. The fiber coupling region 270 corresponds to the area in which fiber-to-chip coupling will be done. In the example of FIG. 4A, the exterframe region 280 includes the optical grating couplers 230 and corresponding portions of the optical waveguides 231 and 233. For edge coupling of optical fibers to the silicon photonics chip 200, the fiber coupling region 270 represents the area where v-groove structures will be formed into the chip 200 (e.g., etched into the silicon of the chip 200), with each of the v-groove structures configured to receive an optical fiber. For adiabatic coupling of optical fibers to the silicon photonics chip 200, the fiber coupling region 270 represents the area where adiabatic coupling will occur between the core of the optical fiber and an optical waveguide within the chip 200.

Figure 4B:
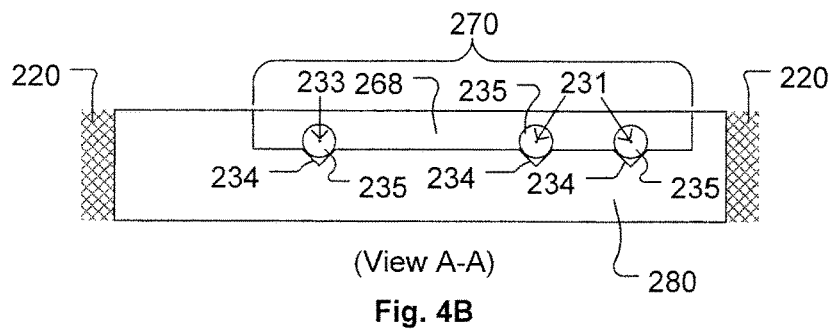
FIG. 4B shows a vertical cross-section view (referenced as View A-A in FIG. 4A) through the chip looking toward the fiber coupling region, in accordance with some embodiments.
Figure 4C:
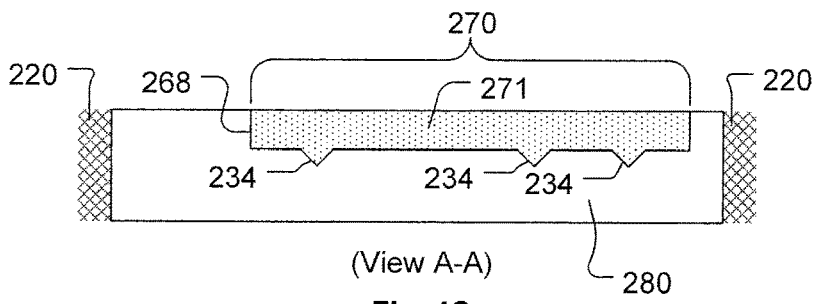
FIG. 4C shows the fiber coupling region after formation of the v-groove structures and filling of the cavity with the temporary filler material, in accordance with some embodiments.

FIG. 4B shows a vertical cross-section view (referenced as View A-A in FIG. 4A) through the chip 200 looking toward the fiber coupling region 270, in accordance with some embodiments. As shown in FIG. 4B, the fiber coupling region 270 is configured to include multiple v-groove structures 234, with each v-groove structure 234 shaped to receive an optical fiber 235. It should be understood that each item referred to herein as a "v-groove" has essentially the same configuration as the v-groove structure 234 of FIG. 4B. Also, it should be understood that the optical fibers 235 are positioned and secured within the v-groove structures 234 after the chip 200 is singulated from the wafer 100. Formation of the fiber coupling region 270 within the chip 200 results in formation of a cavity 268 within the chip 200. Therefore, after the fiber coupling region 270 is formed within the chip 200, the cavity 268 can be filled with a temporary filler material 271 to facilitate further fabrication of the chip 200 and/or wafer 100. Example temporary filler materials 271 include, but are not limited to, Crystalbond 509, 555, and 590, which are soluble in acetone, hot water, and methanol, respectively. FIG. 4C shows the fiber coupling region 270 after formation of the v-groove structures 234 and filling of the cavity 268 with the temporary filler material 271, in accordance with some embodiments.

Figure 5:
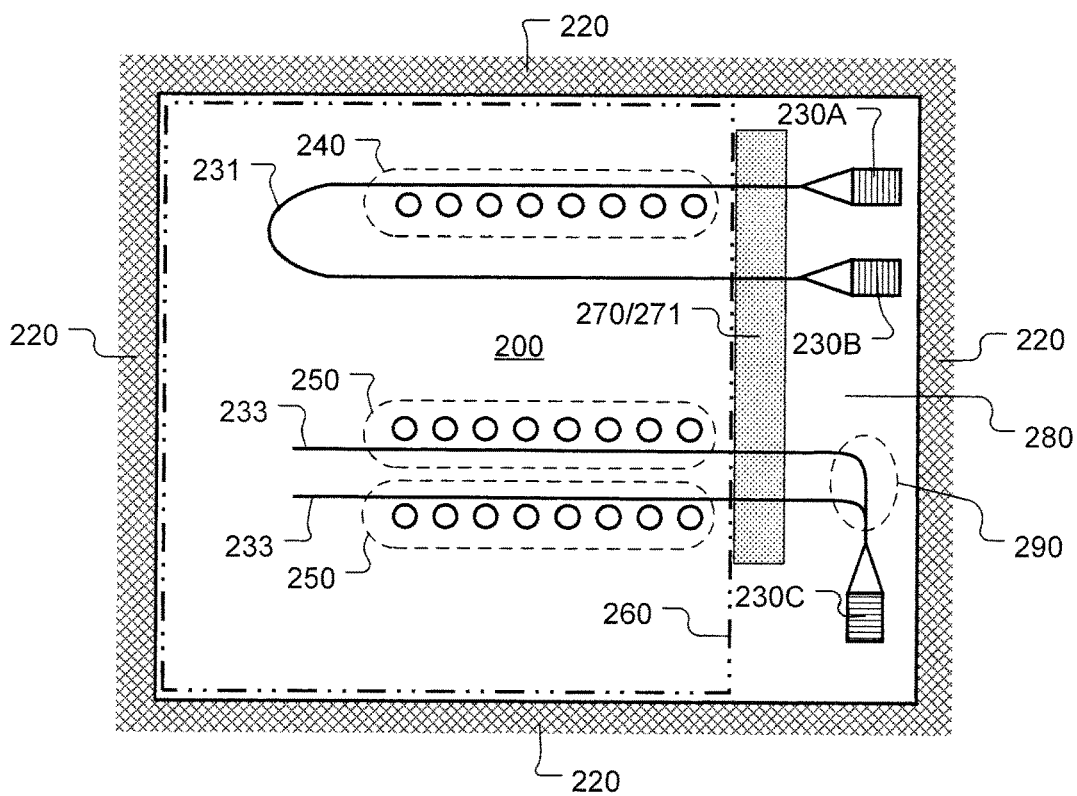
FIG. 5 shows a variation of the example silicon photonics chip of FIG. 4A, in which two optical grating couplers are oriented substantially perpendicular to the right edge of the silicon photonics chip, and in which one optical grating coupler is oriented substantially parallel to the right edge of the silicon photonics chip, in accordance with some embodiments.

In some embodiments, the optical grating couplers 230 are vertical optical grating couplers. In various embodiments, the optical grating couplers 230 can be oriented substantially perpendicular to the edge of the silicon photonics chip 200 and/or substantially parallel to the edge of the silicon photonics chip 200. For example, FIG. 4A shows the optical grating couplers 230 oriented substantially perpendicular to the right edge of the silicon photonics chip 200. FIG. 5 shows a variation of the example silicon photonics chip 200 of FIG. 4A, in which two optical grating couplers 230A and 230B are oriented substantially perpendicular to the right edge of the silicon photonics chip 200, and in which one optical grating coupler 230C is oriented substantially parallel to the right edge of the silicon photonics chip 200, in accordance with some embodiments. FIG. 5 also shows at location 290 how the optical grating coupler 230C that is oriented substantially parallel to the right edge of the silicon photonics chip 200 can be connected to multiple optical waveguides within the exterframe region 280 on the silicon photonics chip 200. It should be understood that in various embodiments any of the optical grating couplers 230, 230A, 230B, 230C can be connected to one or more optical waveguides on the silicon photonics chip 200. For example, in some embodiments, an individual optical grating coupler 230 can be optically connected to an individual photonic circuit in the silicon photonics chip 200. And, in some embodiments, an optical tap (e.g., 3 dB tap) can be used to split the light from an individual optical grating coupler 230 to couple into and interact with multiple separate photonic circuits in the silicon photonics chip 200, such as shown at location 290. Therefore, in various embodiments, any of the optical grating couplers 230 can be used to interact with a plurality of photonic circuits in the silicon photonics chip 200. For example, in some embodiments, a single vertical optical grating coupler 230 can be used to connect to a plurality of transceiver photonic circuits within the chip 200.

As mentioned above, the exterframe region 280 can include active electronic and photonic devices that can be used to facilitate photonic testing. In some embodiments, due to the difficulty of concurrent electrical and optical probing, there is significant utility in aligning a small number (e.g., 1 to 10, by way of example) of optical grating couplers 230 to test the entire silicon photonics chip 200, rather than using a larger number of optical grating couplers 230 to test the entire silicon photonics chip 200. It should be noted that after the silicon photonics chip 200 is tested, the fiber coupling region 270 can be formed to create the v-groove structures 234 necessary for fiber-to-chip coupling and/or to create structures to facilitate optical fiber adiabatic coupling to the chip 200. In this manner, the fiber coupling region 270 is not yet formed during photonic testing of the chip 200. Therefore, during photonic testing of the chip 200 the optical waveguides 231 and 233 extend through the fiber coupling region 270 in an intact configuration to optically connect with the optical grating couplers 230. After completion of the photonic testing of the chip 200, portions of the optical waveguides 231 and 233 that exist within the fiber coupling region 270 will be eliminated during formation of the fiber coupling region 270. In some embodiments, formation of the fiber coupling region 270 can include etching of the ILD layer to expose appropriate structures within the silicon photonics chip 200, such as described in "An O-band metamaterial converter interfacing standard optical fibers to silicon nanophotonic waveguides," by Tymon Barwicz et al., Optical Fiber Communications Conference and Exhibition (OFC), 2015, IEEE, 2015, and such as described in "Low-cost interfacing of fibers to nanophotonic waveguides: design for fabrication and assembly tolerances," by Tymon Barwicz and Yoichi Taira, IEEE Photonics Journal 6.4, 2014, 1-18.

At this stage of fabrication, after formation of the fiber coupling region 270 to create structures necessary for optical fiber edge coupling, e.g., v-groove structures 234, and/or structures to facilitate optical fiber adiabatic coupling, a top surface of the chip 200 is made planar to facilitate subsequent processing of the chip 200 and/or wafer 100. In some embodiments, top surface of the chip 200 is made planar by depositing the temporary filler material 271 on the wafer 100 and within the fiber coupling regions 270 on the chips 200. In some embodiments, the temporary filler material 271 is removed from the chips 200 later during fabrication at the package level.

Figure 6:
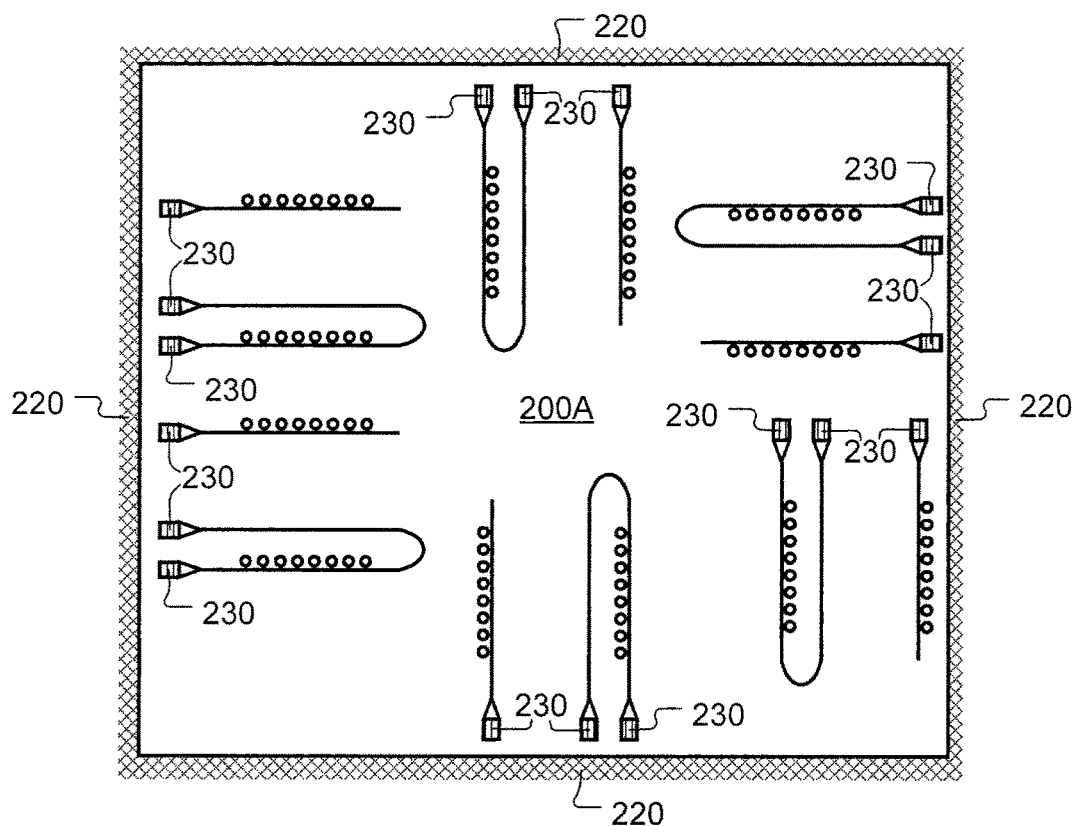
FIG. 6 shows an example silicon photonics chip, in accordance with some embodiments.

FIG. 6 shows an example silicon photonics chip 200A, in accordance with some embodiments. The example silicon photonics chip 200A demonstrates that there are no limitations on placement of the vertical optical couplers 230 relative to the edges of the silicon photonics chip 200A. For example, while the chip 200 of FIG. 4A shows use of one edge of the silicon photonics chip 200 for placement of optical grating couplers 230, the chip 200A of FIG. 6 shows use of four edges of the silicon photonics chip 200A for placement of optical grating couplers 230. Therefore, it should be understood that the optical grating couplers 230 can be located at any one or more edges of the silicon photonics chip 200/200A, as needed. Similarly, the exter-frame region 280, as shown in the example chip 200 of FIG. 4A, can be formed along any one or more edges of the silicon photonics chip 200/200A, as needed.

Figure 7:
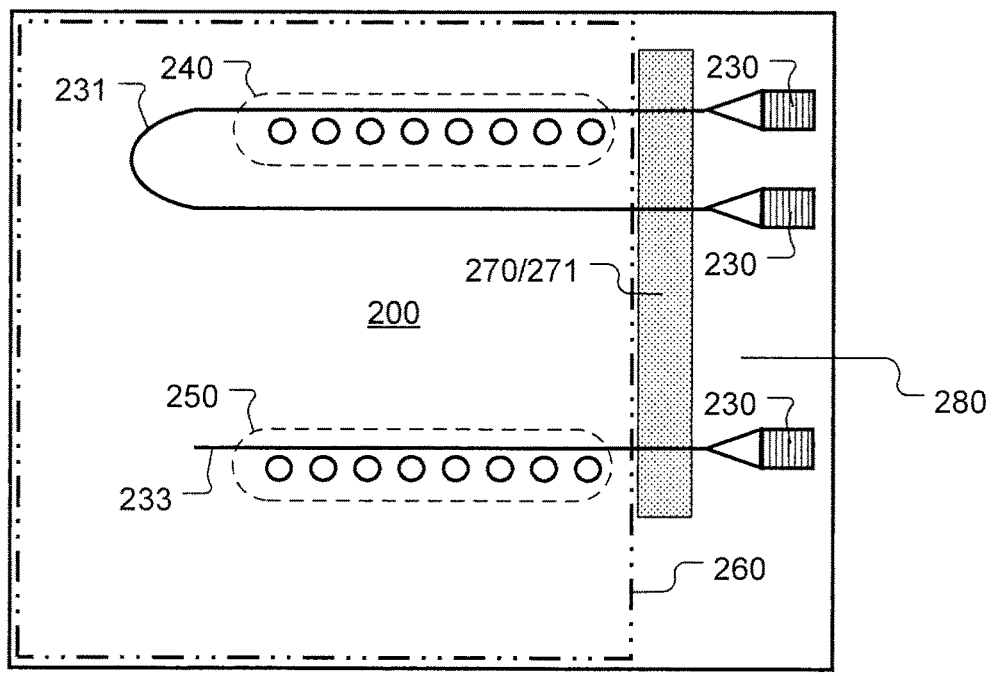
FIG. 7 shows the example silicon photonics chip of FIG. 4A after singulation of the chip from the wafer, in accordance with some embodiments.

FIG. 7 shows the example silicon photonics chip 200 of FIG. 4A after singulation of the chip 200 from the wafer 100, in accordance with some embodiments. It should be understood that prior to singulation of the chip 200 from the wafer 100, the fiber optic attach features are protected by the temporary filler material, e.g., Crystalbond, as previously mentioned.

Figure 8A:
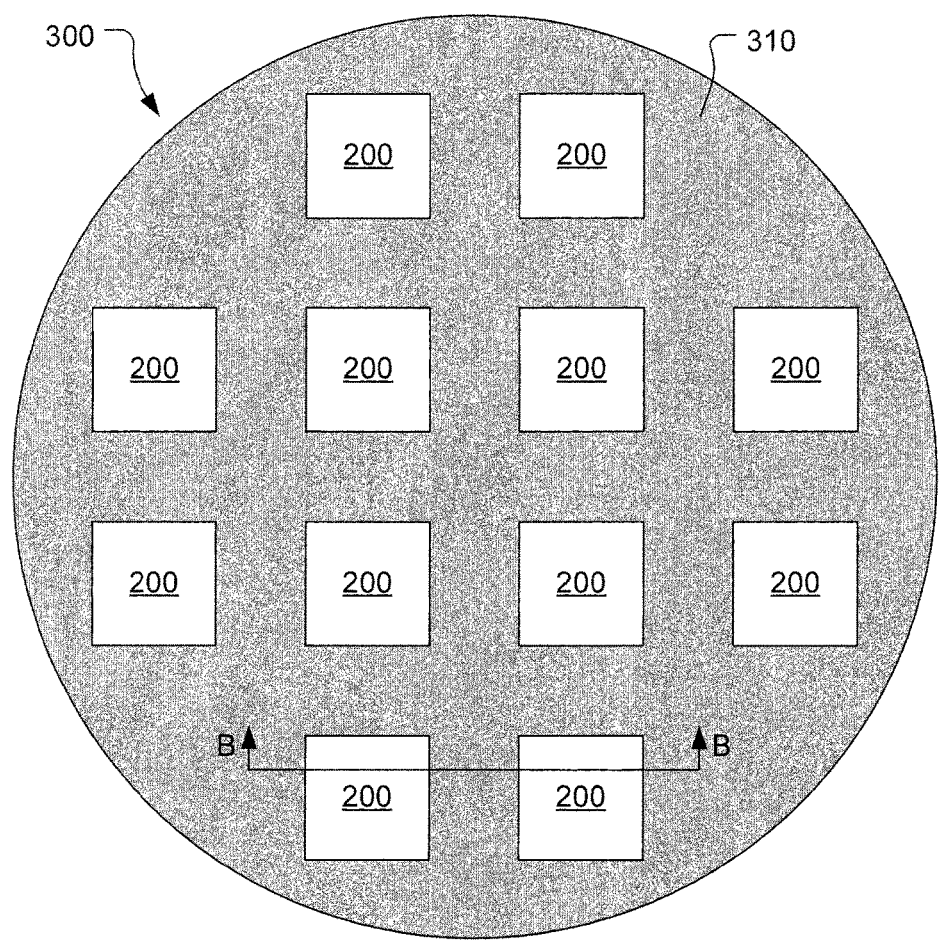
FIG. 8A shows a top view of multiple silicon photonics chips, such as shown in FIG. 7, placed on a temporary wafer, in accordance with some embodiments.
Figure 8B:
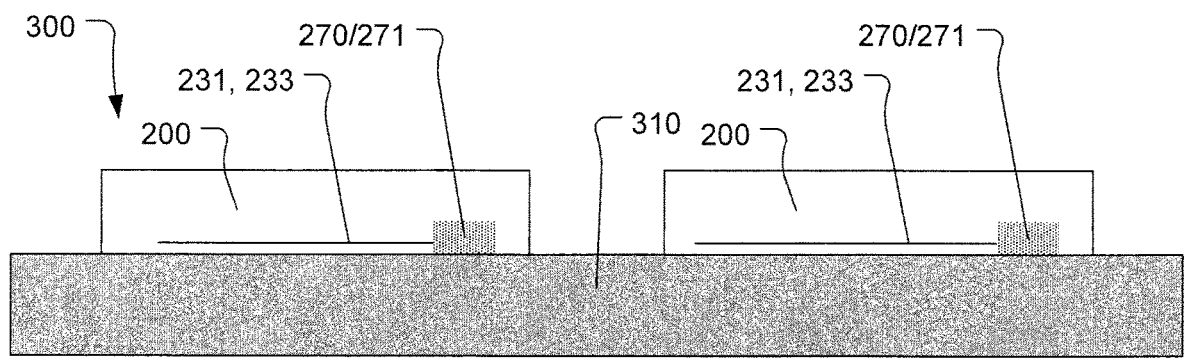
FIG. 8B shows a vertical cross-section view (referenced as View B-B in FIG. 8A) through the configuration of FIG. 8A, in accordance with some embodiments.

Wafer Level Fan-Out (WLFO) technology can be adapted for silicon photonics. FIG. 8A shows a configuration 300 representing an example adaptation of the WLFO technology for silicon photonics. FIG. 8A shows a top view of multiple silicon photonics chips 200, such as shown in FIG. 7, placed on a temporary wafer 310, in accordance with some embodiments. FIG. 8B shows a vertical cross-section view (referenced as View B-B in FIG. 8A) through the configuration 300, in accordance with some embodiments. The chips 200 are positioned on the temporary wafer 310 with the fiber coupling region 270 and the optical grating couplers 230 facing downward toward the temporary wafer 310. It should be understood that the temporary wafer 310 is different and separate from the wafer 100 of FIG. 1 from which the silicon photonics chips 200 were singulated. It should be understood that in various embodiments the wafer 310 can have essentially any horizontal cross-section shape and size, e.g., circular, rectangular, polygonal, among other shapes. In some embodiments, the temporary wafer 310 is formed of silicon or silicon dioxide, among other materials. A temporary adhesive is used to secure the silicon photonics chips 200 to the temporary wafer 310. In some embodiments, the temporary adhesive is BrewerBond 305®, or 3M™ UV-Curable Adhesive LC-4200, among other types of temporary adhesives. It should be understood that WLFO technology supports placement and mounting of multiple chips 200 on a common temporary wafer 310, which is referred to as Heterogeneous Integration (HIT). It should also be understood that WLFO technology can support multi-chip modules (MCM) or HIT.

Figure 9A:
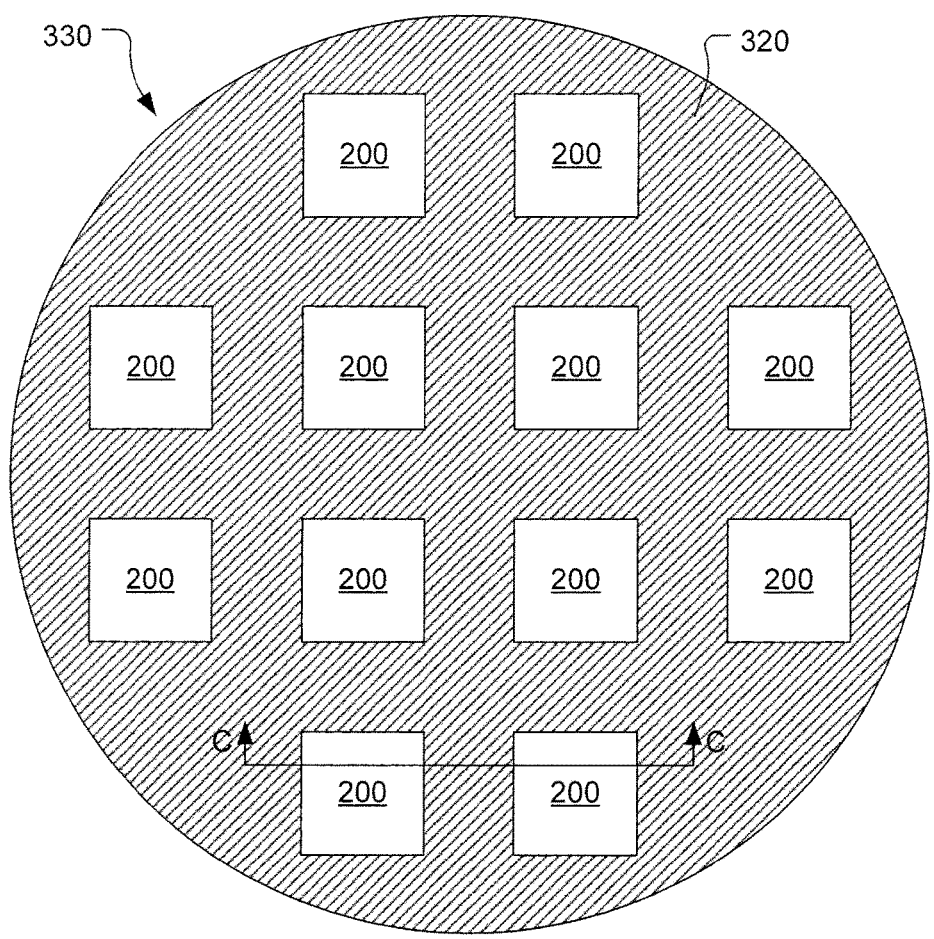
FIG. 9A shows a top view of an assembly resulting from application of a mold compound to the top of the temporary wafer in the configuration of FIG. 8A, in accordance with some embodiments.
Figure 9B:
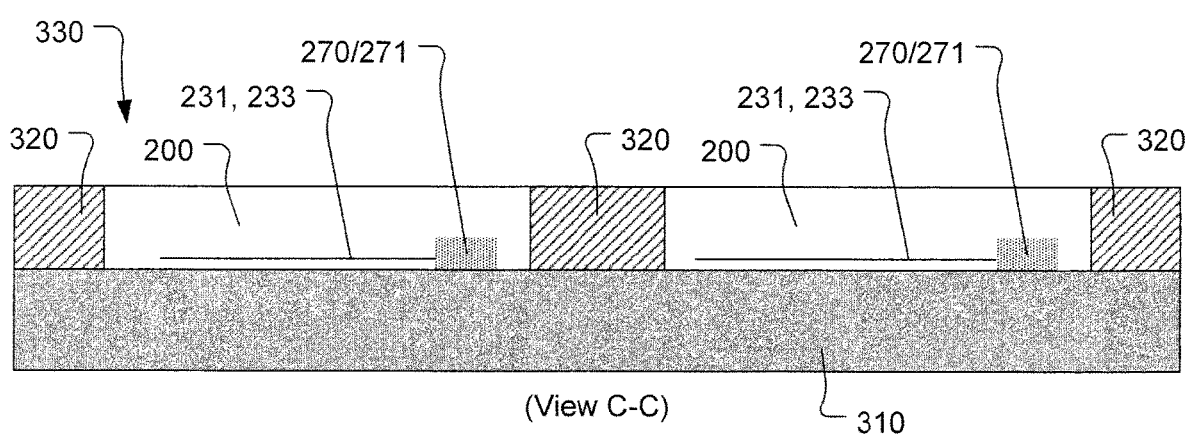
FIG. 9B shows a vertical cross-section view (referenced as View C-C in FIG. 9A) through the configuration of FIG. 9A, in accordance with some embodiments.

FIG. 9A shows a top view of an assembly 330 resulting from application of a mold compound 320 to the top of the temporary wafer 310 in the configuration 300 of FIG. 8A, in accordance with some embodiments. FIG. 9B shows a vertical cross-section view (referenced as View C-C in FIG. 9A) through the configuration 330, in accordance with some embodiments. In some embodiments, the mold compound 320 is epoxy, organosilicone polymers, polyurethanes, polyimides, polyesters, among other types of mold compound material. In some embodiments, the mold compound 320 includes one or more of curing agents, accelerators, fillers, flame retardants, and adhesion promoters. The example assembly 330 of FIGS. 9A and 9B shows how backgrinding of the mold compound 320 can be done to expose the silicon photonics chips 200. However, in some embodiments, the backgrinding of the mold compound 320 can be done to thin the mold compound 320 without exposing the silicon photonics chips 200. Also, in some embodiments, the mold compound 320 is not thinned (not subjected to backgrinding) after deposition and formation of the mold compound 320 on the temporary wafer 310 and over the chips 200. In some embodiments, the mold compound 320 is deposited and formed on the temporary wafer 310 by performing an injection molding process.

Figure 10A:
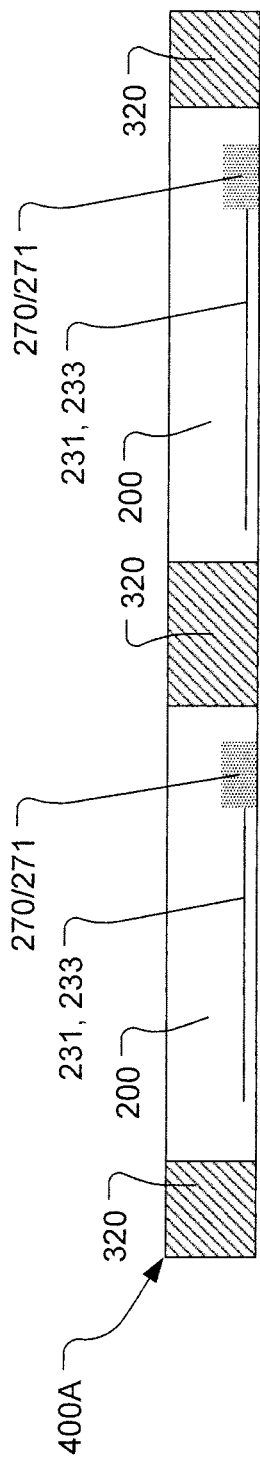
FIG. 10A shows a vertical cross-section through the unitary structure that includes the silicon photonics chips and the surrounding mold compound as shown in FIG. 9B, in accordance with some embodiments.
Figure 10B:
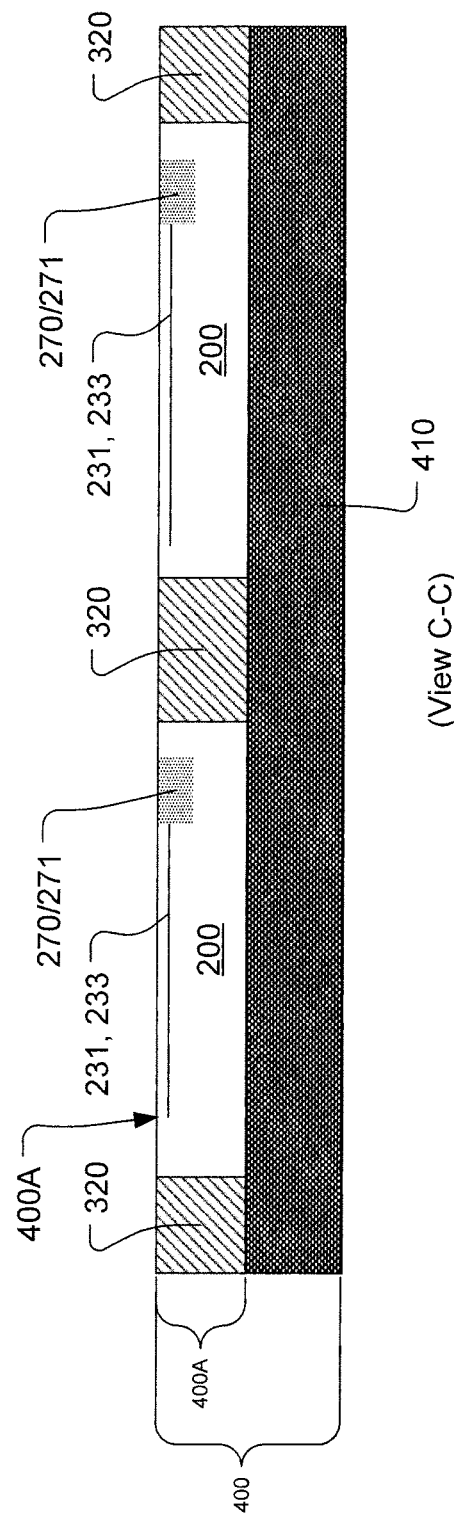
FIG. 10B shows a vertical cross-section through the intermediate assembly, after the unitary structure is removed from the temporary wafer and after the unitary structure is flipped and placed on the wafer, in accordance with some embodiments.

After formation of the mold compound 320, the silicon photonics chips 200 and the mold compound 320 surrounding the chips 200 forms a unitary structure 400A, which is removable from the temporary wafer 310. FIG. 10A shows a vertical cross-section through the unitary structure 400A that includes the silicon photonics chips 200 and the surrounding mold compound 320 as shown in FIG. 9B, in accordance with some embodiments. In some embodiments, after the unitary structure 400A that includes the silicon photonics chips 200 and the surrounding mold compound 320 is removed from the temporary wafer 310, the unitary structure 400A is flipped and placed on another wafer 410. The combination of the unitary structure 400A and the wafer 410 forms an intermediate assembly 400. FIG. 10B shows a vertical cross-section through the intermediate assembly 400, after the unitary structure 400A is removed from the temporary wafer 310 and after the unitary structure 400A is flipped and placed on the wafer 410, in accordance with some embodiments.

Figure 10C:
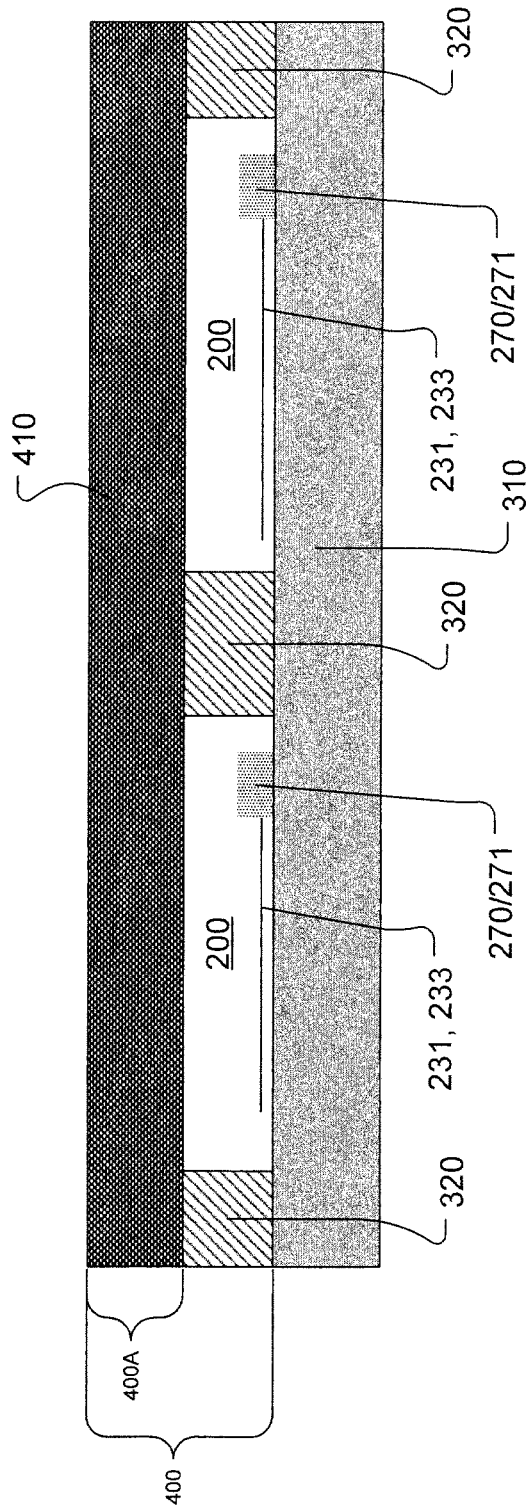
FIG. 10C shows a vertical cross-section through the intermediate assembly, after the unitary structure is flipped and placed on the wafer, with the unitary structure remaining attached to the temporary wafer, in accordance with some embodiments.

In some embodiments, the unitary structure 400A can remain attached to the temporary wafer 310 when the unitary structure 400A is flipped and placed on the wafer 410. FIG. 10C shows a vertical cross-section through the intermediate assembly 400, after the unitary structure 400A is flipped and placed on the wafer 410, with the unitary structure 400A remaining attached to the temporary wafer 310, in accordance with some embodiments. It should be understood that keeping the unitary structure 400A attached to the temporary wafer 310 can help improve the mechanical stability of the unitary structure 400A as the unitary structure 400A is attached to the wafer 410. However, after the unitary structure 400A is attached to the wafer 410, as shown in FIG. 10C, the temporary wafer 310 is removed from the unitary structure 400A to obtain the intermediate assembly 400 as shown in FIG. 10B.

It should be understood that in various embodiments the wafer 410 can have essentially any horizontal cross-section shape and size, e.g., circular, rectangular, polygonal, among other shapes. In some embodiments, the wafer 410 is formed to have a horizontal cross-section shape and size that is similar to the horizontal cross-section shape and size of the unitary structure 400A. In some embodiments, the wafer 410 is formed of silicon or silicon dioxide, among other materials. In some embodiments, the wafer 410 is a temporary support structure. In these embodiments, a temporary adhesive is used to secure unitary structure 400A to the wafer 410. In some embodiments, the temporary adhesive is BrewerBond 305®, or 3M™ UV-Curable Adhesive LC-4200, among other types of temporary adhesives. In some embodiments, the wafer 410 is a permanent support structure. In these embodiments, a permanent adhesive is used to secure unitary structure 400A to the wafer 410. In some embodiments, the permanent adhesive is a thermoplastic adhesive, a thermosetting adhesive, an elastomer adhesive, or a hybrid polymer adhesive, among other types of permanent adhesives.

It should be understood that in the intermediate assembly 400, the temporary filler material 271 is present within the fiber coupling region 270 to protect the optical waveguides of the chip 200 that are exposed within the fiber coupling region 270. It should also be understood that the presence of the temporary filler material 271 to protect the exposed optical structures within fiber coupling region 270 is a feature that enables the WLFO process disclosed herein.

Figure 11A:
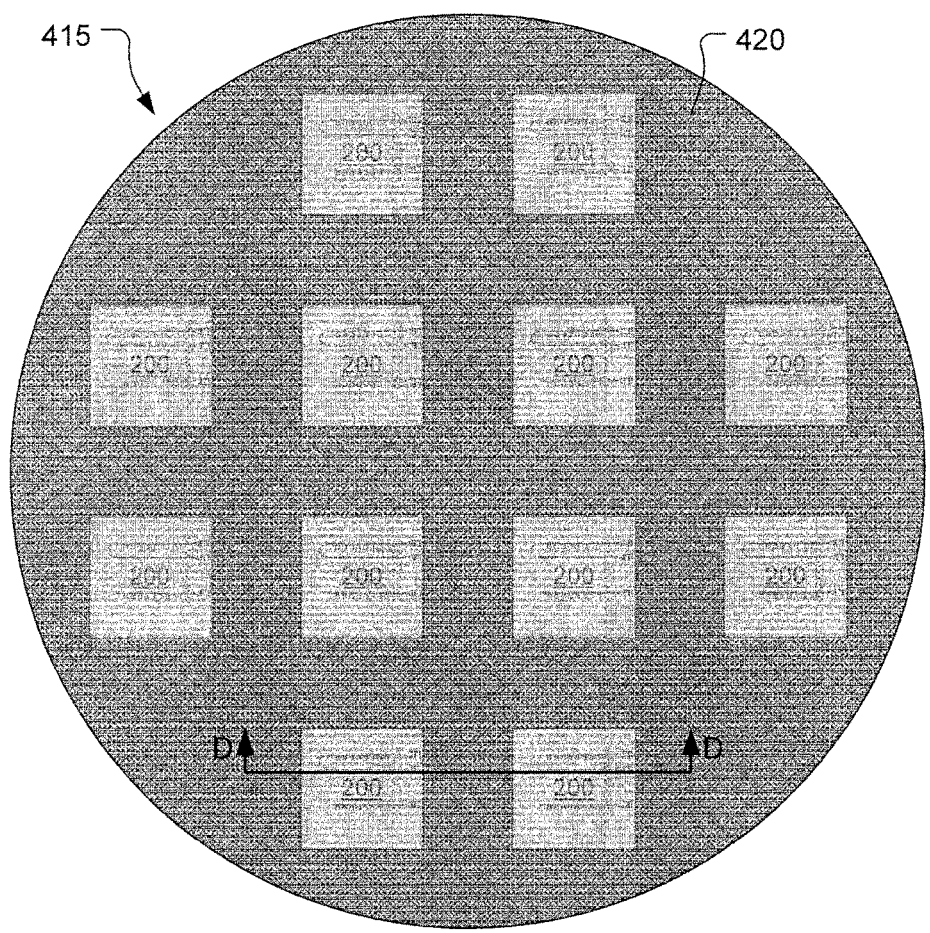
FIG. 11A shows a top view of an assembly that includes the intermediate assembly with an RDL formed over the chips within the intermediate assembly, in accordance with some embodiments.
Figure 11B:
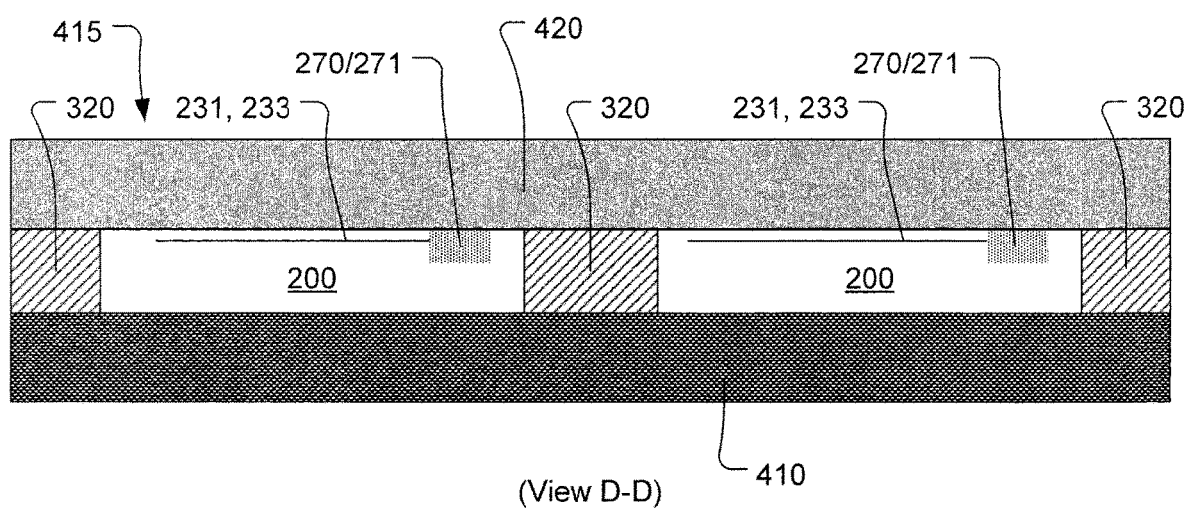
FIG. 11B shows a vertical cross-section view (referenced as View D-D in FIG. 11A) through the assembly of FIG. 11A, in accordance with some embodiments.

In the WLFO process, one or more Redistribution Layers (RDL) are formed over the chips 200. The RDL includes wiring and dielectrics ending in structures suitable for wirebonding or flip-chip connection of the chips 200 to one or more external devices in a packaging process. FIG. 11A shows a top view of an assembly 415 that includes the intermediate assembly 400 with an RDL 420 formed over the chips 200 within the intermediate assembly 400, in accordance with some embodiments. FIG. 11B shows a vertical cross-section view (referenced as View D-D in FIG. 11A) through the assembly 415, in accordance with some embodiments.

Figure 12A:
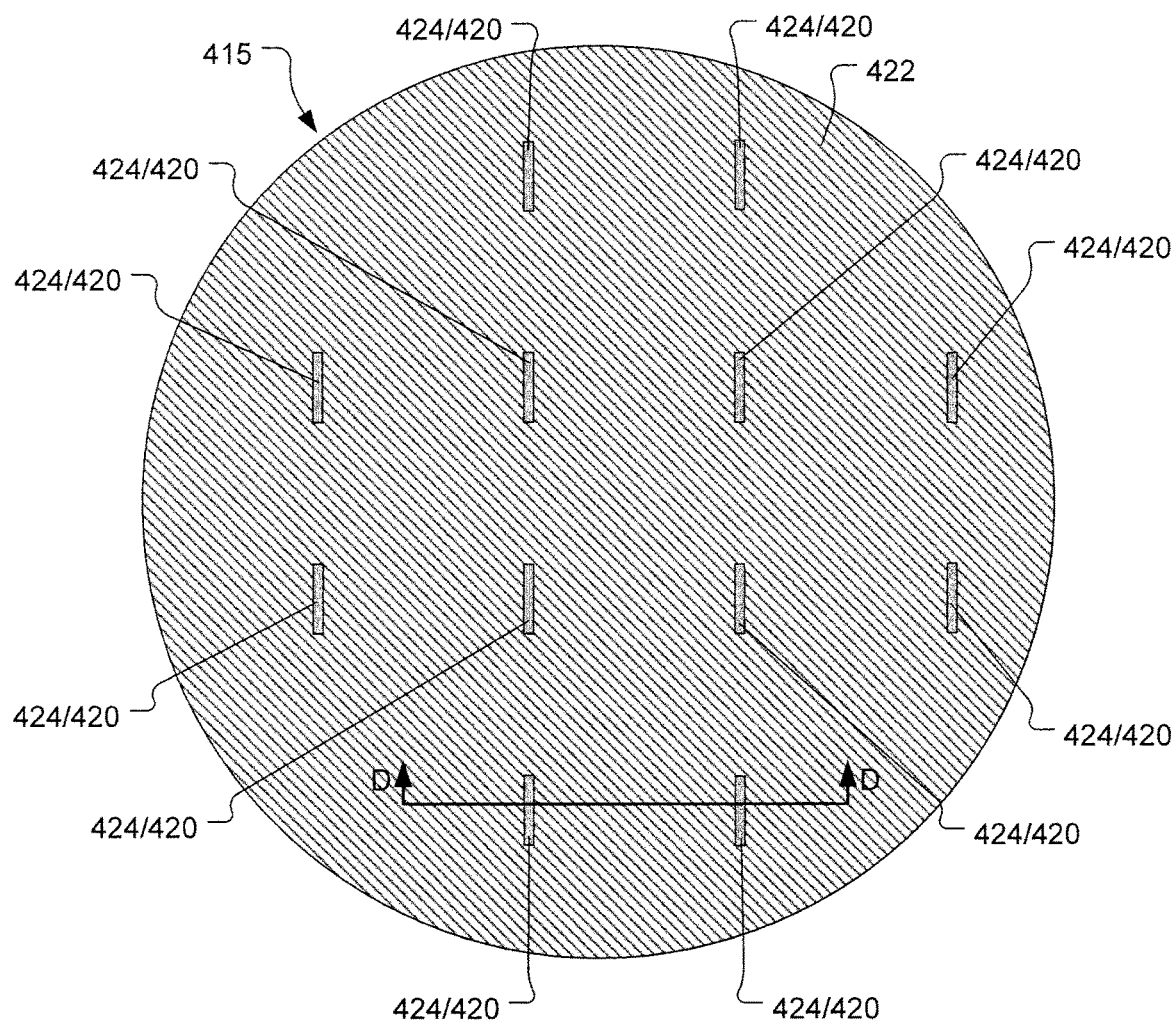
FIG. 12A shows a top view of the assembly of FIG. 11A with a mask disposed over the RDL, in accordance with some embodiments.
Figure 12B:
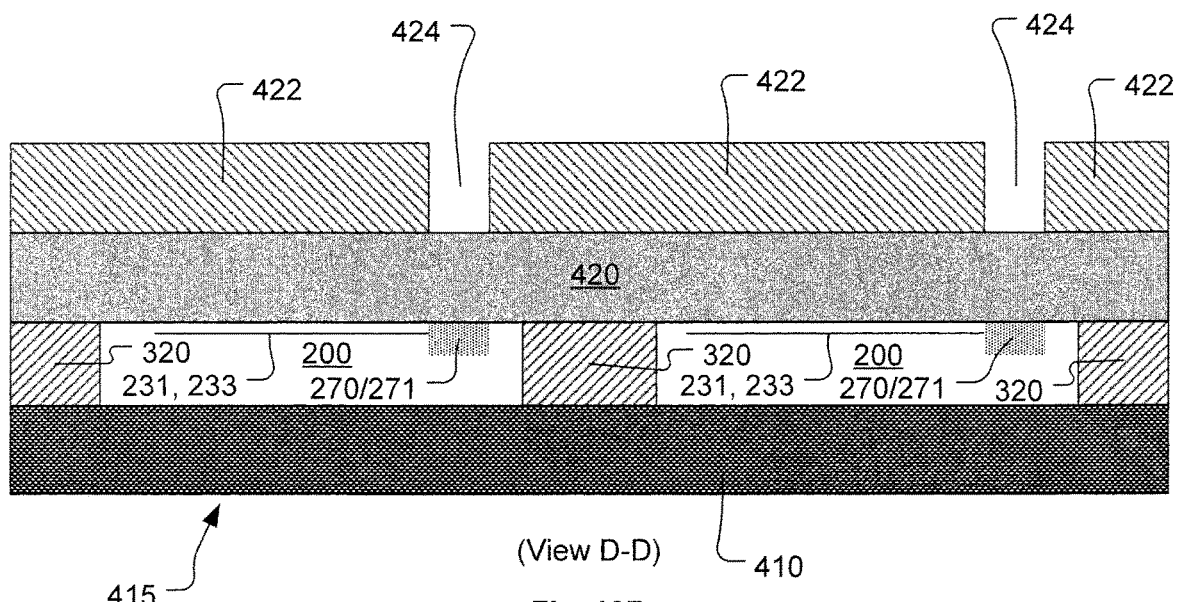
FIG. 12B shows a vertical cross-section view (referenced as View D-D in FIG. 12A) through the assembly of FIG. 11A having the mask disposed thereover, in accordance with some embodiments.

FIG. 12A shows a top view of the assembly 415 with a mask 422 disposed over the RDL 420, in accordance with some embodiments. FIG. 12B shows a vertical cross-section view (referenced as View D-D in FIG. 12A) through the assembly 415 having the mask 422 disposed thereover, in accordance with some embodiments. In various embodiments, the mask 422 is formed of a type of mask material used in semiconductor photolithographic fabrication processes, such as photoresist or polyimide, among other types of mask materials. The mask 422 is formed to include openings 424 configured and positioned to expose portions of the underlying RDL 420 that reside over the fiber coupling region 270 in the various chips 200.

Figure 12C:
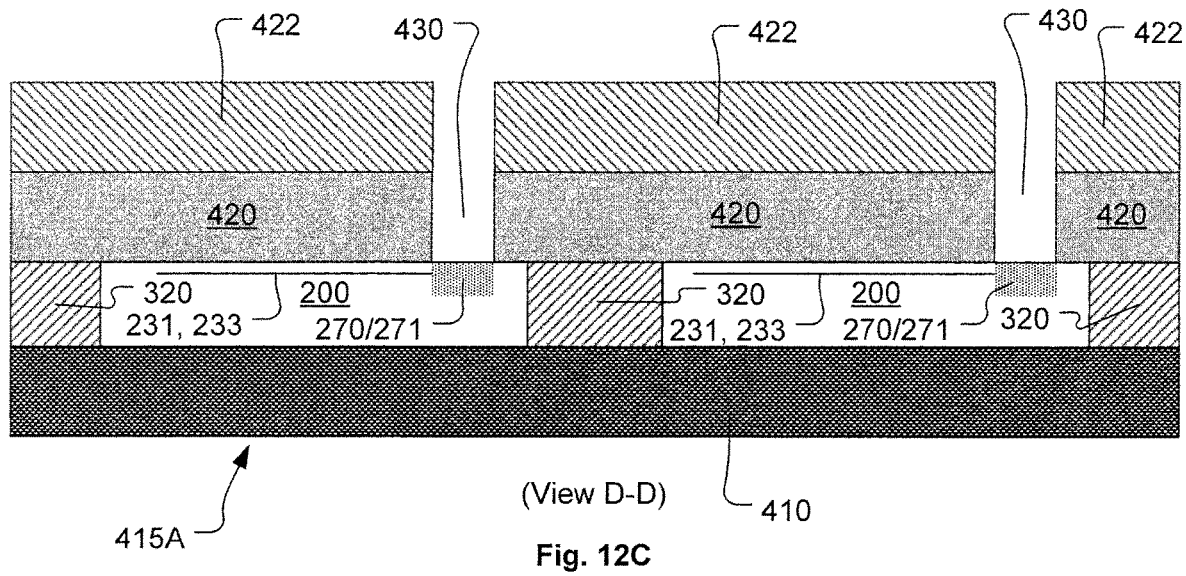
FIG. 12C shows the vertical cross-section view of FIG. 12B with holes formed through the RDL within the openings that are exposed within the mask, in accordance with some embodiments.
Figure 12D:
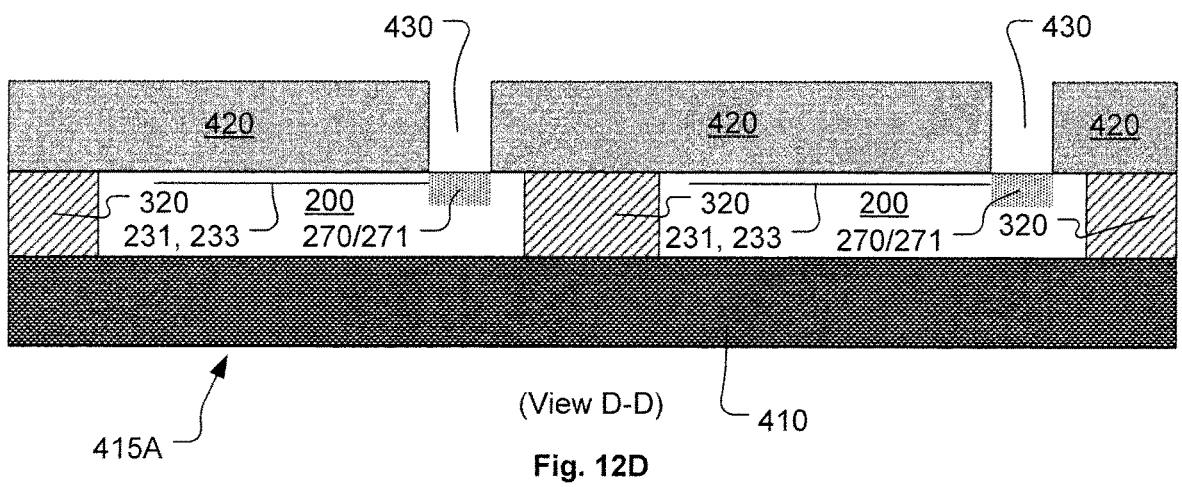
FIG. 12D shows the vertical cross-section view of FIG. 12C with the mask removed from the assembly, in accordance with some embodiments.

An etching process is performed on the assembly 415 to etch holes 430 through the RDL 420 within the openings 424 that are exposed within the mask 422. The assembly 415 with the holes 430 etched through the RDL 420 is referred to as an assembly 415A. FIG. 12C shows the vertical cross-section view of FIG. 12B with holes 430 formed through the RDL 420 within the openings 424 that are exposed within the mask 422, in accordance with some embodiments. After the holes 430 are formed through the RDL 420, the mask 422 is removed from the assembly 415A. FIG. 12D shows the vertical cross-section view of FIG. 12C with the mask 422 removed from the assembly 415A, in accordance with some embodiments. It should be understood that the holes 430 are configured and positioned to expose the fiber coupling regions 270 in the various chips 200, where the fiber coupling regions 270 are still filled with the temporary filler material 271.

Figure 12E:
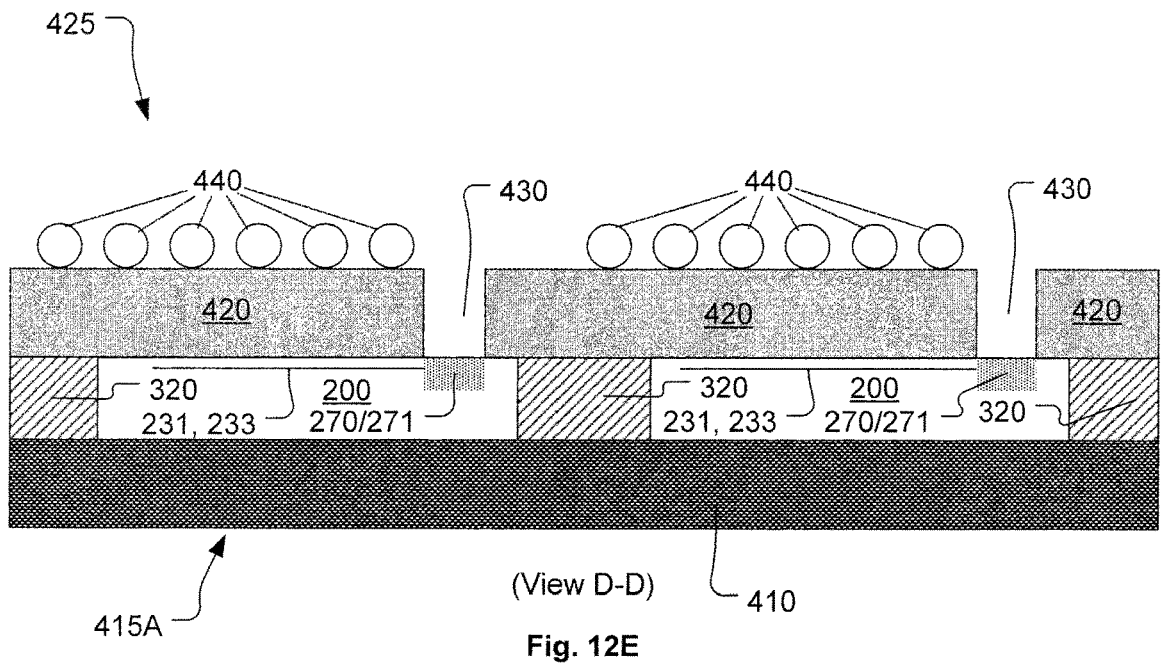
FIG. 12E shows the vertical cross-section view of FIG. 12D with solder balls placed in specified locations on the RDL of the assembly, in accordance with some embodiments.
Figure 12F:
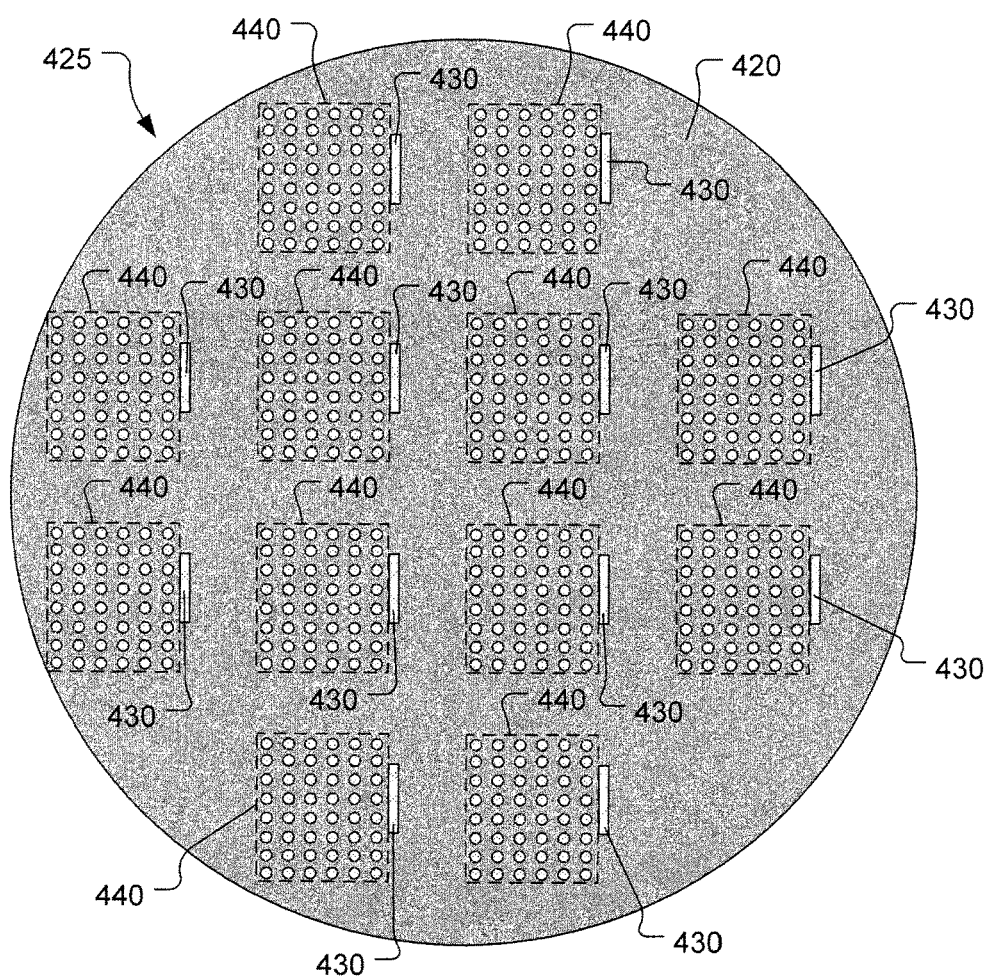
FIG. 12F shows a top view of the assembly with the solder balls placed in specified locations on the RDL, in accordance with some embodiments.

FIG. 12E shows the vertical cross-section view of FIG. 12D with solder balls 440 placed in specified locations on the RDL 420 of the assembly 415A, in accordance with some embodiments. The assembly 415A having the solder balls 440 placed in specified locations on the RDL 420 that corresponds to the various chips 200 is referred to as an assembly 425. In various embodiments, the solder balls 440 on the RDL 420 for each chip 200 can have essentially any configuration and quantity as required by the electrical circuitry of the RDL 420. In some embodiments, the RDL 420 for a given chip 200 is defined to provide for wafer-level fan-out of the electrical connections to the given chip 200. Also, while solder balls 440 are used in the example embodiments disclosed herein, it should be understood that essentially any other type of electrical connection to exposed RDL electrical contact pads for use in flip-chip applications can be substituted for the solder balls 440 in the embodiments disclosed herein. FIG. 12F shows a top view of the assembly 425 with the solder balls 440 placed in specified locations on the RDL 420, in accordance with some embodiments.

Figure 13A:
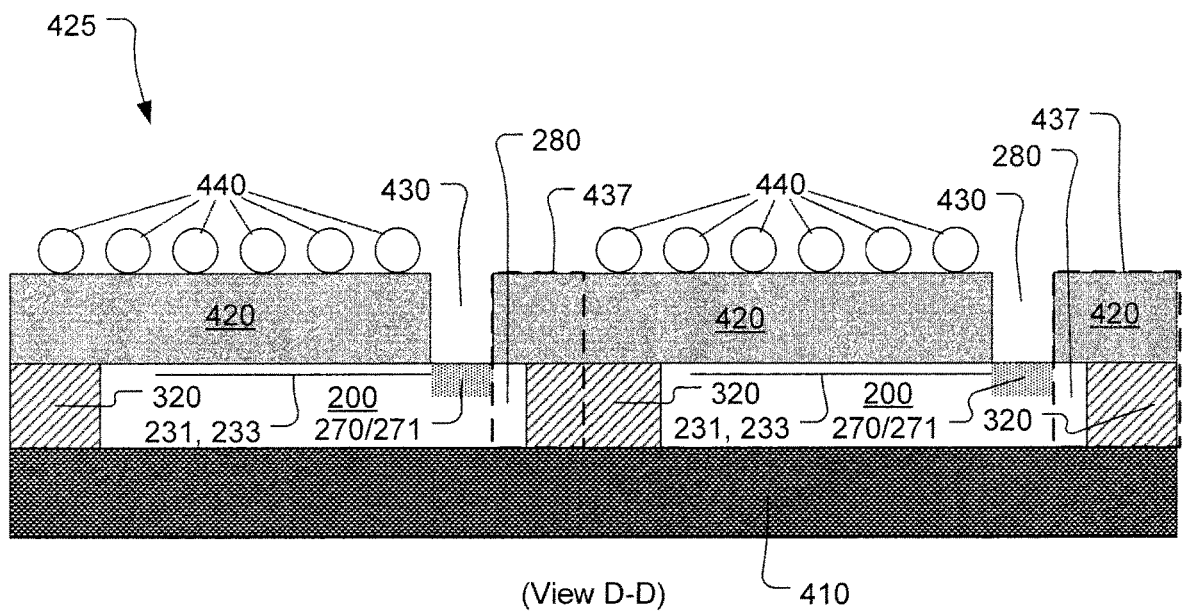
FIG. 13A shows the vertical cross-section view of FIG. 12E with regions of the assembly designated for removal, in accordance with some embodiments.

FIG. 13A shows the vertical cross-section view of FIG. 12E with regions 437 of the assembly 425 designated for removal, in accordance with some embodiments. In the example embodiment of FIG. 13A, each of the regions 437 includes one or more portion(s) of the RDL 420, one or more portion(s) of the mold compound 320, and one or more portion(s) of chip(s) 200. In some embodiments, the regions 437 are configured to include the exterframe regions 280 of the chip 200 in which the optical grating couplers 230 and corresponding optical waveguides are formed to enable wafer-level photonic testing of the chips 200. The regions 437 are also defined to that when the various materials within the regions 437 are removed, the fiber coupling regions 270 of the chips 200 will be exposed in a manner conducive to placement of optical fibers within the fiber coupling regions 270.

Figure 13B:
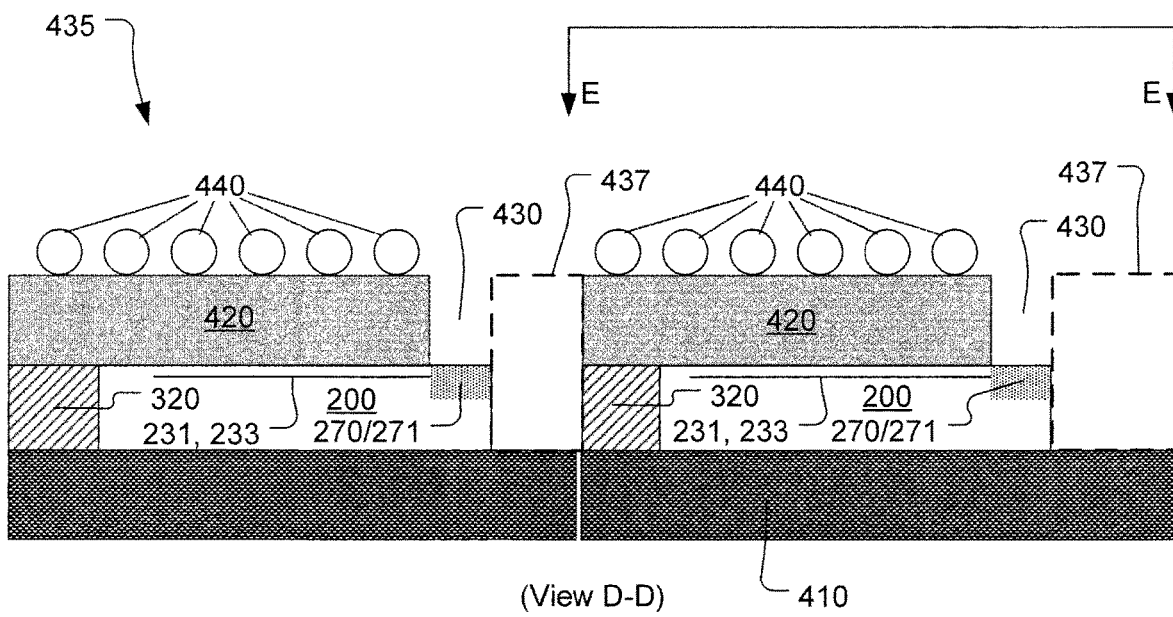
FIG. 13B shows the vertical cross-section view of FIG. 13A after removal of the materials within the regions, in accordance with some embodiments.
Figure 13C:
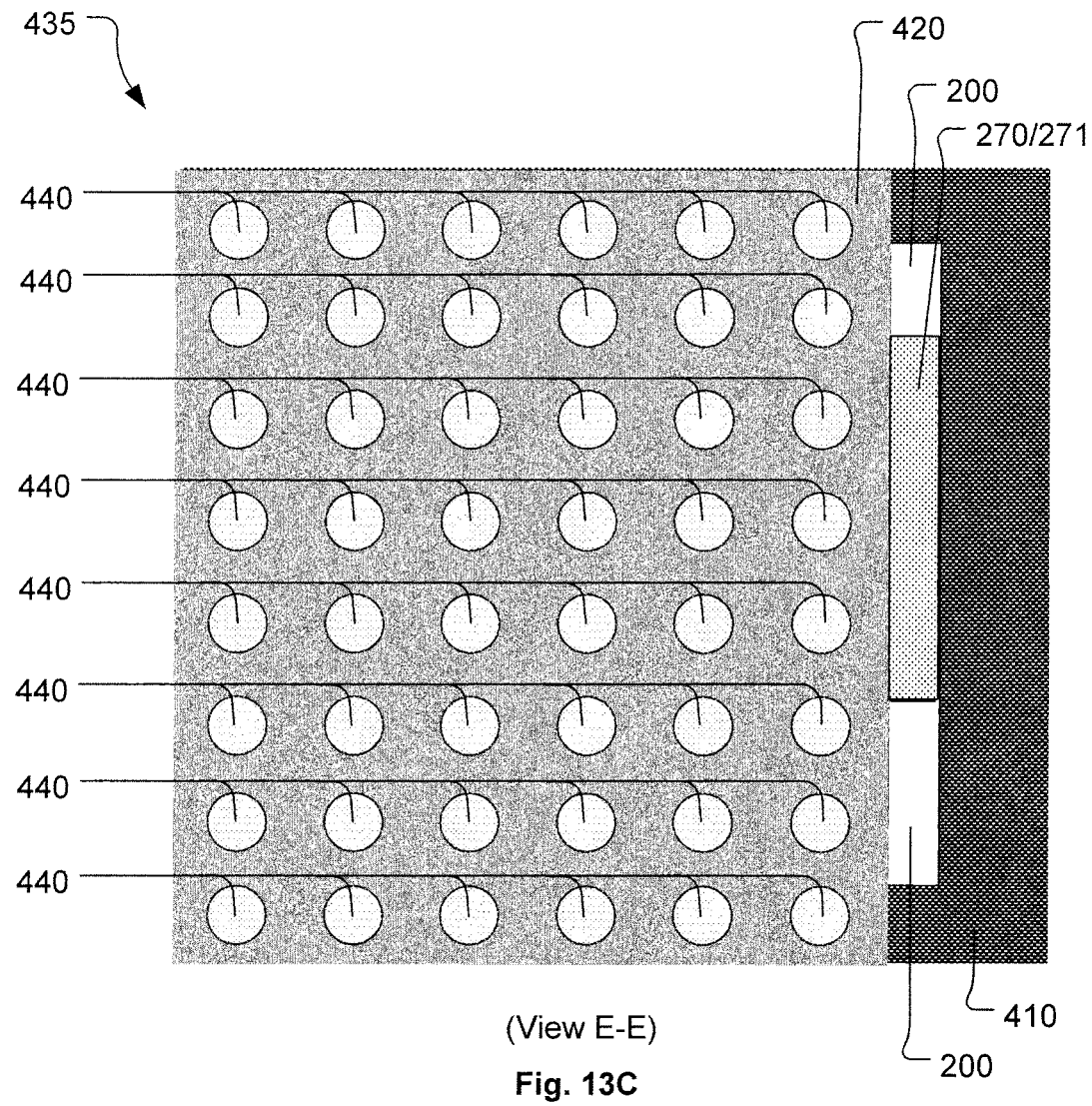
FIG. 13C shows a top view of the singulated chip (referenced as View E-E in FIG. 13B), in accordance with some embodiments.

FIG. 13B shows the vertical cross-section view of FIG. 13A after removal of the materials within the regions 437, in accordance with some embodiments. The assembly 425 having the materials within the regions 437 removed is referred to as an assembly 435. In some embodiments, the assembly 425 of FIG. 13A is etched to remove the portions 437 so as to arrive at the assembly 435. In some embodiments, the wafer 410 in the assembly 425 of FIG. 13A is singulated/diced/cut to remove the portions 437 so as to arrive at the assembly 435. It should be understood that removal of the portions 437 of the assembly 425 can be done to remove the optical grating couplers 230 and associated photonic and/or electrical circuits within the exterframe regions 280 of the chips 200. In various embodiments, one or more semiconductor fabrication process(es) such as reactive ion etching, plasma dicing, and/or mechanical dicing, among others, can be used to remove the materials within the regions 437. In some embodiments, the process used to remove the materials within the regions 437 can also be used to singulate the wafer 410 so as to obtain the individual chips 200 with their corresponding RDL and solder ball 440 configurations in physically separate form. In some embodiments, the wafer 410 can be singulated in one or more separate process(es) after completion of removal of the materials within the regions 437. The vertical cross-section of FIG. 13B shows the wafer 410 in singulated form. FIG. 13C shows a top view of the singulated chip 200 (referenced as View E-E in FIG. 13B), in accordance with some embodiments. In the embodiment of FIG. 13C, the portion of the wafer 410 corresponding to the singulated chip 200 is shown as remaining attached to the singulated chip 200. In various embodiments, the portion of the wafer 410 corresponding to the singulated chip 200 can remain attached to the singulated chip 200 or can be removed from the singulated chip 200.

Figure 14A:
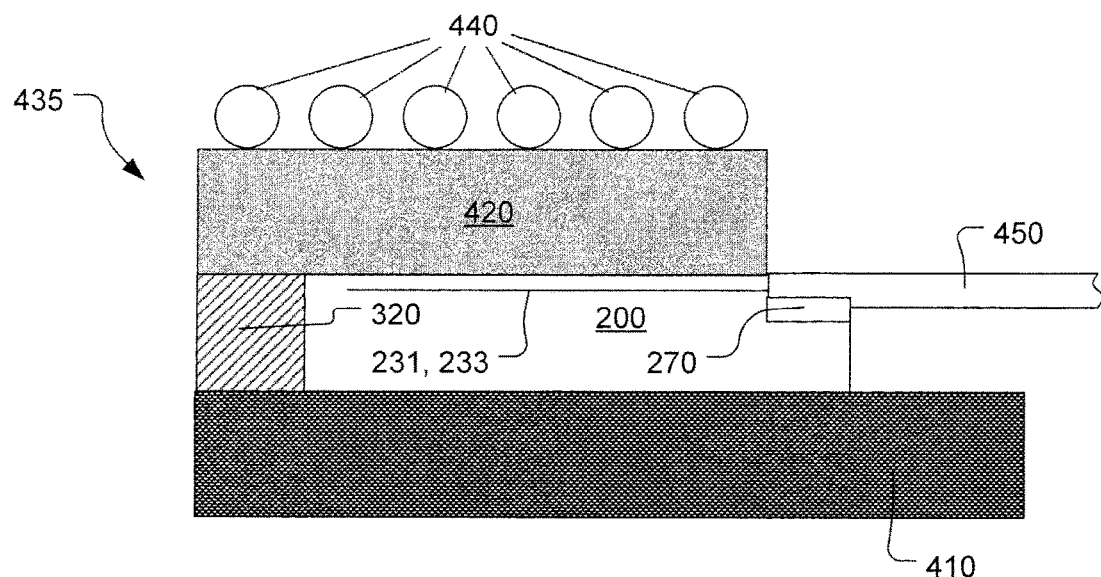
FIG. 14A shows a vertical cross-section view of the singulated chip with the temporary filler material removed from the fiber coupling region and with an optical fiber positioned within the fiber coupling region, in accordance with some embodiments.
Figure 14B:
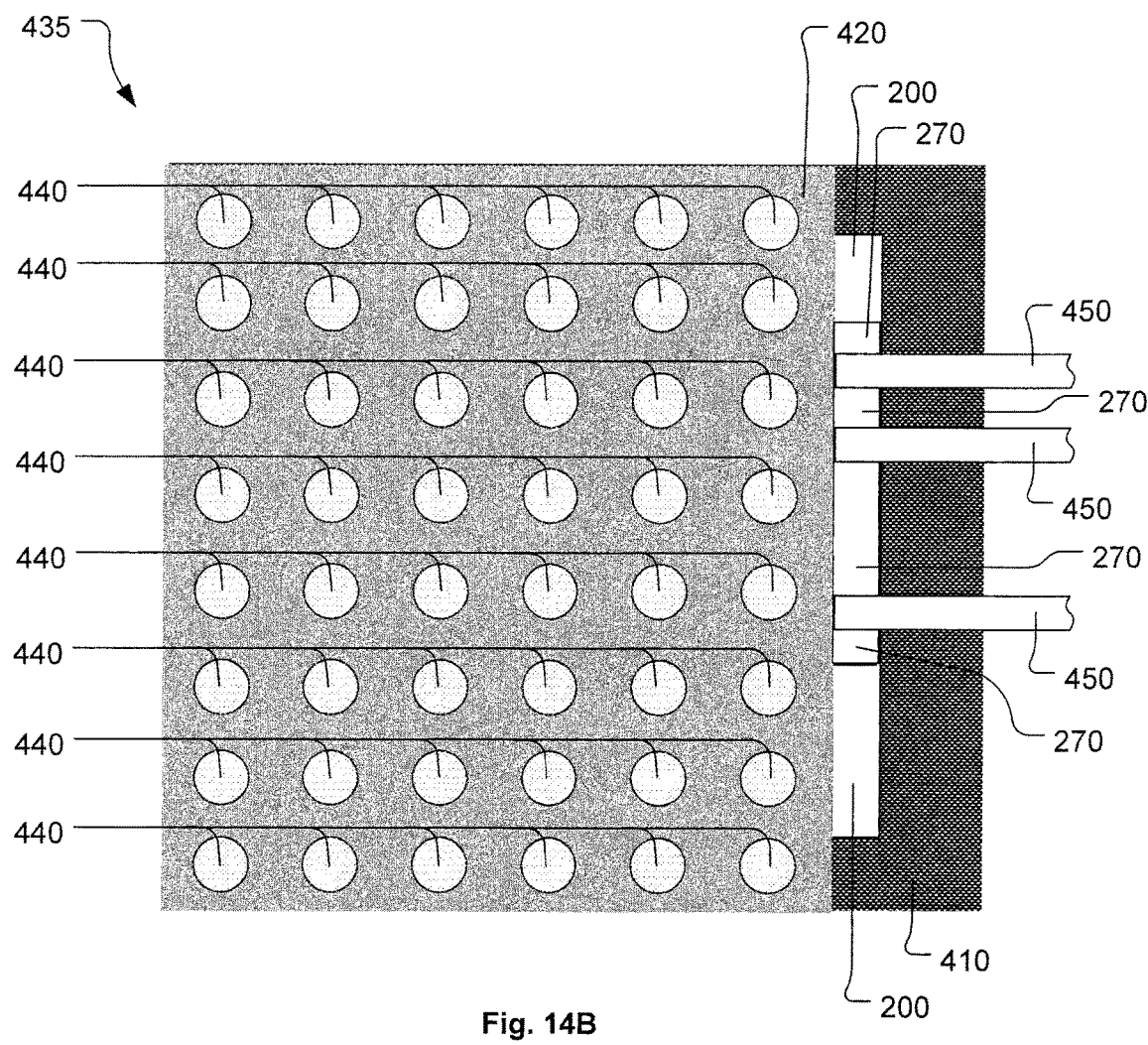
FIG. 14B shows a top view of the singulated chip of FIG. 14A, with the temporary filler material within the fiber coupling region removed and with optical fibers positioned within the fiber coupling region, in accordance with some embodiments.

After the singulated chip 200 is obtained by singulating the wafer 410, the temporary filler material 271 within the fiber coupling region 270 of the singulated chip 200 is removed to enable positioning of optical fibers within the fiber coupling region 270. FIG. 14A shows a vertical cross-section view of the singulated chip 200 with the temporary filler material 271 removed from the fiber coupling region 270 and with an optical fiber 450 positioned within the fiber coupling region 270, in accordance with some embodiments. The configuration of FIG. 14A is referred to as an assembly 435. In some embodiments, the optical fiber(s) 450 are positioned within v-grooves structure 234 within the fiber coupling region 270, such as described with regard to FIG. 4B. In various embodiments, standard optical fiber attach processes can be used to attach the optical fiber(s) 450 to the silicon photonics chip 200. FIG. 14B shows a top view of the singulated chip 200 of FIG. 14A, with the temporary filler material 271 within the fiber coupling region 270 removed and with optical fibers 450 positioned within the fiber coupling region 270, in accordance with some embodiments.

Figure 15A:
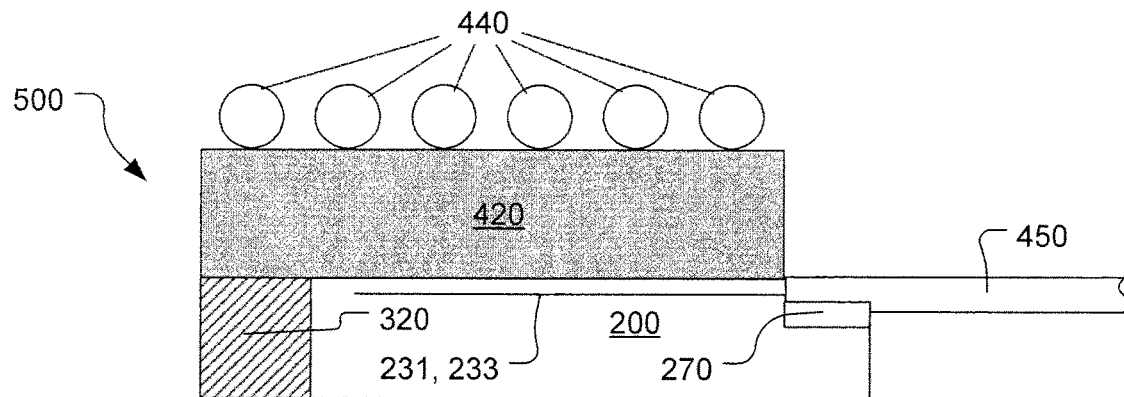
FIG. 15A shows the vertical cross-section view of the singulated chip of FIG. 14A, with the portion of the wafer removed from the chip and mold material, in accordance with some embodiments.
Figure 15B:
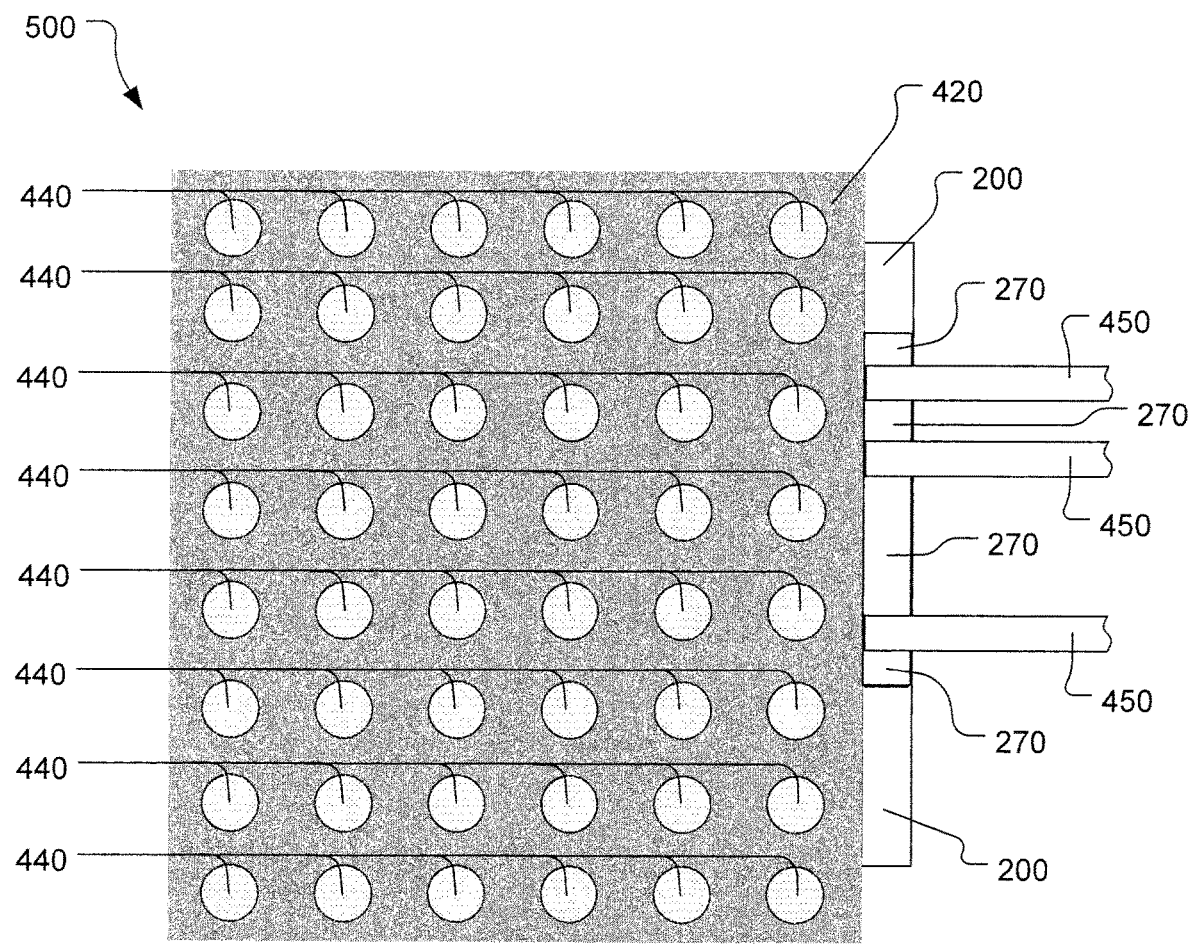
FIG. 15B shows a top view of the singulated chip of FIG. 15A, in accordance with some embodiments.

FIG. 15A shows the vertical cross-section view of the singulated chip 200 of FIG. 14A, with the portion of the wafer 410 removed from the chip 200 and mold material 320, in accordance with some embodiments. The configuration of FIG. 15A is referred to as an assembly 500. FIG. 15B shows a top view of the singulated chip 200 of FIG. 15A, in accordance with some embodiments.

As previously mentioned, in various embodiments, the wafer 410 may or may not be temporary. If the wafer 410 is temporary, the portion of the wafer 410 corresponding to the singulated chip 200 is removed as shown in the assembly 500 of FIGS. 15A and 15B. However, if the wafer 410 is not temporary, the portion of the wafer 410 corresponding to the singulated chip 200 is retained as shown in the assembly 435 of FIGS. 14A and 14B. If the wafer 410 is not temporary, the wafer 410 is configured to accommodate the thermal requirements of the package. For example, if the wafer 410 is not temporary, the wafer 410 is formed of a material that has acceptable coefficient of thermal expansion and an acceptably high thermal conductivity.

In some embodiments, a silicon photonics chip package assembly is disclosed. The package assembly includes a silicon photonics chip that includes at least one optical waveguide exposed at a first side of the silicon photonics chip. The silicon photonics chip also includes an optical fiber coupling region formed along a portion of the first side of the silicon photonics chip. The package assembly also includes a mold compound structure formed to extend around a second side, a third side, and a fourth side of the silicon photonics chip. The mold compound structure has a vertical thickness substantially equal to a vertical thickness of the silicon photonics chip. The package assembly also includes a redistribution layer formed over the silicon photonics chip and over a portion of the mold compound structure. The redistribution layer includes electrically conductive interconnect structures to provide fanout of electrical contacts on the silicon photonics chip to corresponding electrical contacts on an exposed surface of the redistribution layer. The redistribution layer is formed to leave the optical fiber coupling region exposed. The package assembly also includes at least one optical fiber connected to the optical fiber coupling region in optical alignment with the at least one optical waveguide within the silicon photonics chip.

In some embodiments, the vertical thickness of the optical fiber coupling region is less than an entire vertical thickness of the silicon photonics chip. In some embodiments, the optical fiber coupling region includes at least one v-groove configured to respectively receive the at least one optical fiber. Each of the at least one v-groove is configured to passively align a core of a corresponding one of the at least one optical fiber with a corresponding one of the at least one optical waveguide. In some embodiments, the optical fiber coupling region is configured to respectively edge couple the at least one optical fiber to the at least one optical waveguide. In some embodiments, the optical fiber coupling region is configured to respectively adiabatically couple the at least one optical fiber to the at least one optical waveguide. In some embodiments, the at least one optical fiber is connected to the optical fiber coupling region by an adhesive.

In some embodiments, the package assembly includes solder balls respectively connected to the electrical contacts on the exposed surface of the redistribution layer. In some embodiments, an outer perimeter of the redistribution layer is substantially aligned with an outer perimeter of the mold compound structure along the second, third, and fourth sides of the silicon photonics chip. In some embodiments, the package assembly also includes a wafer formed to support the silicon photonics chip and the mold compound structure. In some embodiments, the silicon photonics chip is permanently attached to the wafer, and the mold compound structure is permanently attached to the wafer. In some embodiments, an outer perimeter of the redistribution layer is substantially aligned with an outer perimeter of the mold compound structure along the second, third, and fourth sides of the silicon photonics chip, and the outer perimeter of the mold compound structure is substantially aligned with an outer perimeter of the wafer along the second, third, and fourth sides of the silicon photonics chip.

In some embodiments, a silicon photonics chip is disclosed. In some embodiments, the silicon photonics chip is one of multiple silicon photonics chips on a same wafer. In some embodiments, each of the multiple silicon photonics chips is formed in a substantially same manner. The chip includes a frame region that includes a number of photonics devices and a number of optical waveguides. In some embodiments, the number of photonics devices within the frame region include an optical data transmit circuit and an optical data receive circuit. The chip also includes an exterframe region formed outside of the frame region. The exterframe region includes a number of optical grating couplers and corresponding optical waveguides. The optical grating couplers are optically connected to some of the number of optical waveguides within the frame region to enable testing of the number of photonics devices within the frame region. In some embodiments, at least one of the number of optical grating couplers within the exterframe region is simultaneously optically connected to a plurality of optical waveguides within the frame region.

In some embodiments, a silicon photonics chip is disclosed. In some embodiments, the chip is one of multiple silicon photonics chips on a same wafer. In some embodiments, each of the multiple silicon photonics chips on the wafer is formed in a substantially same manner. The chip includes a frame region that includes a number of photonics devices and a number of optical waveguides. The chip also includes an optical fiber coupling region that includes a cavity formed along a side of the frame region. The optical fiber coupling region includes a number of optical fiber alignment features. The optical fiber coupling region is formed between the frame region and an exterframe region. The exterframe region includes a number of optical grating couplers and corresponding optical waveguides usable for testing of the number of photonics devices within the frame region before formation of the optical fiber coupling region. The chip also includes a filler material disposed within the cavity of the optical fiber coupling region, such that an exposed surface of the filler material is substantially planar with a surface of the silicon photonics chip adjacent to the optical fiber coupling region. In some embodiments, the filler material is removable from the cavity of the optical fiber coupling region during packaging of the silicon photonics chip. In some embodiments, each of the number of optical fiber alignment features within the optical fiber coupling region is configured to receive a respective optical fiber upon removal of the exterframe region from the silicon photonics chip. In some embodiments, at least one of the number of optical fiber alignment features is a v-groove configured to enable edge-coupling of a corresponding optical fiber with a corresponding one of the number of optical waveguides within the frame region. In some embodiments, at least one of the number of optical fiber alignment features is configured to enable adiabatic-coupling of a corresponding optical fiber with a corresponding one of the number of optical waveguides within the frame region.

FIG. 16 shows a flowchart of a method for wafer-level processing of silicon photonics chips, in accordance with some embodiments. The method includes an operation 1601 for having a wafer including a plurality of silicon photonics chips formed within the wafer. Each silicon photonics chip including a frame region. The frame region includes a number of photonics devices and a number of optical waveguides. Each silicon photonics chip includes an exterframe region. The exterframe region includes a number of optical grating couplers optically connected to some of the number of optical waveguides within the frame region to enable testing of the number of photonics devices within the frame region.

The method also includes an operation 1603 for optically testing the number of photonics devices within the frame region of each of the plurality of silicon photonics chips with the wafer intact. In some embodiments, optically testing the number of photonics devices includes optically testing an optical data transmit circuit and an optical data receive circuit within the frame region of each of the plurality of silicon photonics chips on the wafer. The method also includes an operation 1605 for forming an optical fiber coupling region within each of the plurality of silicon photonics chips, with the wafer intact, after completion of optical testing of the number of photonics devices. The optical fiber coupling region of a given silicon photonics chip includes a cavity formed along a side of the frame region of the given silicon photonics chip. The optical fiber coupling region of the given silicon photonics chip is formed between the frame region and the exterframe region of the given silicon photonics chip. The optical fiber coupling region of the given silicon photonics chip includes a number of optical fiber alignment features. In some embodiments, each of the number of optical fiber alignment features is configured to receive a respective optical fiber upon removal of the exterframe region from the silicon photonics chip. In some embodiments, at least one of the number of optical fiber alignment features is a v-groove configured to enable edge-coupling of a corresponding optical fiber with a corresponding one of the number of optical waveguides within the frame region. In some embodiments, at least one of the number of optical fiber alignment features is configured to enable adiabatic-coupling of a corresponding optical fiber with a corresponding one of the number of optical waveguides within the frame region.

The method also includes an operation 1607 for disposing a filler material within the cavity of the optical fiber coupling region of each silicon photonics chip on the wafer, such that an exposed surface of the filler material is substantially planar with a surface of the silicon photonics chip adjacent to the optical fiber coupling region. The filler material is removable from the cavity of the optical fiber coupling region during subsequent packaging of the silicon photonics chip. The method also includes singulating the plurality of silicon photonics chips from the wafer after completion of disposing the filler material within the cavity of the optical fiber coupling region of each silicon photonics chip on the wafer.

FIG. 17 shows a flowchart of a method for packaging a silicon photonics chip, in accordance with some embodiments. The method includes an operation 1701 for having a plurality of silicon photonics chips. Each of the plurality of silicon photonics chips includes a frame region that includes a number of photonics devices and a number of optical waveguides. Each of the plurality of silicon photonics chips includes an optical fiber coupling region that includes a cavity formed along a side of the frame region. The optical fiber coupling region includes a number of optical fiber alignment features. The cavity of the optical fiber coupling region is filled with a filler material. In some embodiments, the filler material is disposed within the cavity of the optical fiber coupling region such that an exposed surface of the filler material is substantially planar with a surface of the silicon photonics chip adjacent to the optical fiber coupling region.

Each of the plurality of silicon photonics chips includes an exterframe region that includes a number of optical grating couplers and corresponding optical waveguides. The optical fiber coupling region is formed between the frame region and the exterframe region in each of the plurality of silicon photonics chips. In some embodiments, for a given silicon photonics chip, the number of optical grating couplers and corresponding optical waveguides within the exterframe region were previously usable for testing of the number of photonics devices within the frame region before formation of the optical fiber coupling region.

The method also includes an operation 1703 for temporarily securing the plurality of silicon photonics chips to a first support wafer, with the filler material facing toward the first support wafer. In some embodiments, a temporary adhesive is used to temporarily secure the plurality of silicon photonics chips to the first support wafer. The method also includes an operation 1705 for disposing a mold compound material over the support wafer and around each of the plurality of silicon photonics chips, such that an upper surface of the mold compound material is substantially planar with exposed surfaces of the plurality of silicon photonics chips. The mold compound and the plurality of silicon photonics chips collectively form a unitary structure.

The method also includes an operation 1707 for removing the first support wafer from the unitary structure of the mold compound and the plurality of silicon photonics chips. The method also includes an operation 1709 for securing the unitary structure of the mold compound and the plurality of silicon photonics chips to a second support wafer, with the filler material facing away from the second support wafer. The method also includes an operation 1711 for forming a redistribution layer over the unitary structure of the mold compound and the plurality of silicon photonics chips. The redistribution layer includes electrically conductive interconnect structures to provide fanout of electrical contacts on each of the plurality of silicon photonics chips to corresponding electrical contacts on an exposed surface of the redistribution layer. The redistribution layer is formed to leave the optical fiber coupling region of each of the plurality of silicon photonics chips exposed. In some embodiments, forming the redistribution layer includes forming a photolithography patterned mask over the redistribution layer, where the photolithography patterned mask includes openings to expose portions of the underlying redistribution layer that overlie the optical fiber coupling regions of the plurality of silicon photonics chips. In these embodiments, forming the redistribution layer includes performing an etching process to remove portions of the redistribution layer exposed through the openings to expose the optical fiber coupling region of each of the plurality of silicon photonics chips.

The method also includes an operation 1713 for trimming each of the plurality of silicon photonics chips to remove both the corresponding exterframe region and a portion of the redistribution layer overlying the corresponding exterframe region. The trimming exposes a side of the optical fiber coupling region of each of the plurality of silicon photonics chips. In some embodiments, trimming each of the plurality of silicon photonics chips includes removing both a portion of mold compound material adjacent to the corresponding exterframe region and a portion of the redistribution layer overlying the portion of the mold compound material. In some embodiments, the trimming includes forming a photolithography patterned mask over the redistribution layer, where the photolithography patterned mask includes openings to expose portions of the underlying redistribution layer. In these embodiments, the trimming includes performing an etching process to remove portions of the redistribution layer and the exterframe region exposed through the openings.

The method also includes an operation 1715 for singulating the second support wafer to obtain each of the plurality of silicon photonics chips in a separately packaged form. In some embodiments, singulating the second support wafer is done by performing an etching process on the second support wafer. In some embodiments, the etching process to singulate the second support wafer is a continuation of the etching process of the trimming in operation 1713. In some embodiments, singulating the second support wafer is done by cutting the second support wafer. In some embodiments, the method includes removing a remaining portion of the second support wafer from the silicon photonics chip in the separately packaged form.

In some embodiments, the method further includes attaching solder balls to the electrical contacts on the exposed surface of the redistribution layer for each of the plurality of silicon photonics chips. In some embodiments, the solder balls are attached before trimming each of the plurality of silicon photonics chips. In some embodiments, the solder balls are attached after trimming each of the plurality of silicon photonics chips. In some embodiments, the solder balls are attached before singulating the second support wafer. In some embodiments, the solder balls are attached after singulating the second support wafer.

In some embodiments, the method further includes removing the filler material from the cavity of the optical fiber coupling region of a given one of the plurality of silicon photonics chips. In these embodiments, the method also includes attaching a number of optical fibers to respective ones of the number of optical fiber alignment features within the optical fiber coupling region. In some embodiments, at least one of the number of optical fibers is edge-coupled to a corresponding optical waveguide within the frame region of the given one of the plurality of silicon photonics chips. In some embodiments, at least one of the number of optical fibers is adiabatically-coupled to a corresponding optical waveguide within the frame region of the given one of the plurality of silicon photonics chips.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A method for packaging a silicon photonics chip, comprising:
   having a plurality of silicon photonics chips, each of the plurality of silicon photonics chips including a frame region that includes a number of photonics devices and a number of optical waveguides, each of the plurality of silicon photonics chips including an optical fiber coupling region that includes a cavity formed along a side of the frame region, the optical fiber coupling region including a number of optical fiber alignment features, the cavity of the optical fiber coupling region filled with a filler material, each of the plurality of silicon photonics chips including an exterframe region that includes a number of optical grating couplers and corresponding optical waveguides, the optical fiber coupling region formed between the frame region and the exterframe region in each of the plurality of silicon photonics chips;
   temporarily securing the plurality of silicon photonics chips to a first support wafer with the filler material facing toward the first support wafer;
   disposing a mold compound material over the support wafer and around each of the plurality of silicon photonics chips, such that an upper surface of the mold compound material is substantially planar with exposed surfaces of the plurality of silicon photonics chips, the mold compound and the plurality of silicon photonics chips collectively forming a unitary structure;

removing the first support wafer from the unitary structure of the mold compound and the plurality of silicon photonics chips;

securing the unitary structure of the mold compound and the plurality of silicon photonics chips to a second support wafer with the filler material facing away from the second support wafer;

forming a redistribution layer over the unitary structure of the mold compound and the plurality of silicon photonics chips, the redistribution layer including electrically conductive interconnect structures to provide fanout of electrical contacts on each of the plurality of silicon photonics chips to corresponding electrical contacts on an exposed surface of the redistribution layer, wherein the redistribution layer is formed to leave the optical fiber coupling region of each of the plurality of silicon photonics chips exposed;

trimming each of the plurality of silicon photonics chips to remove both the corresponding exterframe region and a portion of the redistribution layer overlying the corresponding exterframe region, wherein the trimming exposes a side of the optical fiber coupling region of each of the plurality of silicon photonics chips; and singulating the second support wafer to obtain each of the plurality of silicon photonics chips in a separately packaged form.

2. The method as recited in claim 1, further comprising: attaching solder balls to the electrical contacts on the exposed surface of the redistribution layer for each of the plurality of silicon photonics chips.

3. The method as recited in claim 2, wherein the solder balls are attached before trimming each of the plurality of silicon photonics chips.

4. The method as recited in claim 2, wherein the solder balls are attached after trimming each of the plurality of silicon photonics chips.

5. The method as recited in claim 2, wherein the solder balls are attached before singulating the second support wafer.

6. The method as recited in claim 2, wherein the solder balls are attached after singulating the second support wafer.

7. The method as recited in claim 1, further comprising:
removing the filler material from the cavity of the optical fiber coupling region of a given one of the plurality of silicon photonics chips; and
attaching a number of optical fibers to respective ones of the number of optical fiber alignment features within the optical fiber coupling region.

8. The method as recited in claim 7, wherein at least one of the number of optical fibers is edge-coupled to a corresponding optical waveguide within the frame region of the given one of the plurality of silicon photonics chips.

9. The method as recited in claim 7, wherein at least one of the number of optical fibers is adiabatically-coupled to a corresponding optical waveguide within the frame region of the given one of the plurality of silicon photonics chips.

10. The method as recited in claim 1, wherein trimming each of the plurality of silicon photonics chips includes removing both a portion of mold compound material adjacent to the corresponding exterframe region and a portion of the redistribution layer overlying the portion of the mold compound material.

11. The method as recited in claim 1, wherein forming the redistribution layer includes forming a photolithography patterned mask over the redistribution layer, the photolithography patterned mask including openings to expose portions of the underlying redistribution layer that overlie the optical fiber coupling regions of the plurality of silicon photonics chips, and wherein forming the redistribution layer includes performing an etching process to remove portions of the redistribution layer exposed through the openings to expose the optical fiber coupling region of each of the plurality of silicon photonics chips.

12. The method as recited in claim 1, wherein the trimming includes forming a photolithography patterned mask over the redistribution layer, the photolithography patterned mask including openings to expose portions of the underlying redistribution layer, the trimming including performing an etching process to remove portions of the redistribution layer and the exterframe region exposed through the openings.

13. The method as recited in claim 12, wherein singulating the second support wafer is done by performing an etching process on the second support wafer.

14. The method as recited in claim 13, wherein the etching process to singulate the second support wafer is a continuation of the etching process of the trimming.

15. The method as recited in claim 1, wherein singulating the second support wafer is done by cutting the second support wafer.

16. The method as recited in claim 1, wherein, for a given silicon photonics chip, the number of optical grating couplers and corresponding optical waveguides within the exterframe region were previously usable for testing of the number of photonics devices within the frame region before formation of the optical fiber coupling region.

17. The method as recited in claim 1, wherein the filler material is disposed within the cavity of the optical fiber coupling region such that an exposed surface of the filler material is substantially planar with a surface of the silicon photonics chip adjacent to the optical fiber coupling region.

18. The method as recited in claim 1, further comprising:
removing a remaining portion of the second support wafer from the silicon photonics chip in the separately packaged form.

* * * * *